(12) United States Patent
Marutani

(10) Patent No.: US 7,388,416 B2
(45) Date of Patent: Jun. 17, 2008

(54) LATCH CIRCUIT, 4-PHASE CLOCK GENERATOR, AND RECEIVING CIRCUIT

(75) Inventor: Masazumi Marutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/187,840

(22) Filed: Jul. 25, 2005

(65) Prior Publication Data
US 2006/0152269 A1    Jul. 13, 2006

(30) Foreign Application Priority Data

Jan. 7, 2005 (JP) ............................. 2005-003096
May 31, 2005 (JP) ............................. 2005-159460

(51) Int. Cl.
*H03K 3/12* (2006.01)

(52) U.S. Cl. ................... 327/201; 327/200; 327/203; 327/206; 327/208; 327/211

(58) Field of Classification Search ....................... None
See application file for complete search history.

(56) References Cited

U.S. PATENT DOCUMENTS

| | | | | |
|---|---|---|---|---|
| 4,845,675 A * | 7/1989 | Krenik et al. | ............... | 365/203 |
| 6,191,629 B1 * | 2/2001 | Bisanti et al. | ............... | 327/202 |
| 6,278,308 B1 * | 8/2001 | Partovi et al. | ............... | 327/218 |
| 6,424,181 B1 * | 7/2002 | Pogrebnoy | .................... | 327/55 |
| 6,433,586 B2 * | 8/2002 | Ooishi | ......................... | 326/93 |
| 6,437,624 B1 * | 8/2002 | Kojima et al. | ............... | 327/211 |
| 6,472,920 B1 * | 10/2002 | Cho et al. | ................... | 327/215 |
| 7,057,421 B2 * | 6/2006 | Shi et al. | ...................... | 327/55 |
| 7,082,053 B1 * | 7/2006 | Jenne et al. | ................ | 365/173 |
| 2003/0201800 A1 | 10/2003 | Matsuo et al. | ................ | 327/57 |
| 2006/0012408 A1 * | 1/2006 | Kushner | ..................... | 327/112 |
| 2006/0104123 A1 * | 5/2006 | Razavi et al. | .......... | 365/189.05 |
| 2006/0146958 A1 * | 7/2006 | Doi | ............................ | 375/318 |

FOREIGN PATENT DOCUMENTS

| | | |
|---|---|---|
| JP | 63-051716 A | 3/1988 |
| JP | 04-373210 A | 12/1992 |
| JP | 06-053764 A | 2/1994 |
| JP | 2003-512752 A | 4/2003 |
| WO | 01/29965 A1 | 4/2001 |

OTHER PUBLICATIONS

Jiren Yuan, et al.; "New Single-Clock CMOS Latches and Flipflops with Improved Speed and Power Savings"; IEE Journal of Solid-State Circuits, vol. 32, No. 1; Jan. 1997.

* cited by examiner

*Primary Examiner*—Tuan T. Lam
*Assistant Examiner*—Hiep Nguyen
(74) *Attorney, Agent, or Firm*—Arent Fox LLP

(57) ABSTRACT

A latch circuit includes a voltage driven type data reading unit and a voltage driven type data holding unit, and operates based on a clock signal that is supplied from an outside source. The data reading unit reads both a first input data and a second input data, and outputs both a first output data and a second output data based on both the first input data and the second input data, while the data holding unit holds both the first output data and the second output data. Both the first input data and the second input data are differential signals, and both the first output data and the second output data are differential signals that have phases that are inverted.

13 Claims, 21 Drawing Sheets

LATCH CIRCUIT, 4-PHASE CLOCK GENERATOR, AND RECEIVING CIRCUIT

CROSS-REFERENCE TO RELATED APPLICATIONS

This application is based upon and claims the benefit of priority from the prior Japanese Patent Application No. 2005-003096 and 2005-159460, filed on Jan. 7, 2005 and May 31, 2005, the entire contents of which are incorporated herein by reference.

BACKGROUND OF THE INVENTION

1) Field of the Invention

The present invention relates to a latch circuit, a 4-phase clock generator, and a receiving circuit, and particularly to a latch circuit, a 4-phase clock generator, and a receiving circuit which are used in radio communication technique such as IQ receiving method using 4-phase clock signals that have phases that are shifted by 90 degree.

2) Description of the Related Art

Radio waves are used for various applications. Much demand of usage of radio waves causes the shortage of frequency resources, and many signals are thereby present in a remarkably small frequency range. When signals are in such a situation, the signals often come under the inference of interference with near-by frequency and jamming signal called image signal. Consequently, a new technique comes to be required to eliminate this influence. An IQ receiving method is one of such techniques. In this method, phases of clock signals are shifted by 90 degree and the clock signals are used to compensate for an interference component between a target main signal and a jamming signal. On the other hand, in the field of portable terminals, lower power consumption in devices or circuits has been strongly desired along with spread and enhancement of the portable terminal.

There have been disclosed several 4-phase clock generators that generate clock signals with phases shifted by 90 degree. Some 4-phase clock generators use a plurality of RC filters or CR filters called polyphase filter. Some use a fixed delay block, and others acquire an output from an appropriate node in the DLL circuit. These 4-phase clock generators are suitable for applications in a single frequency or narrow frequency range, however, are not suitable for applications in a remarkably large frequency setting range such as a receiving terminal of TV broadcasting.

Some 4-phase clock generators, used for applications in a large frequency range, use a feature that a phase in an intermediate node in the 2-frequency-divider circuit is shifted by 90 degree for a phase of the final output signal. The 2-frequency-divider circuit is generally realized by interconnecting two latch circuits or latch circuits, as disclosed in IEEE Journal of Solid State Circuit, Unite States, 1997, volume 32, No. 1, pp. 62-69, "New Single-Clock CMOS Latches and Flip-flop with Improved Speed and Power Saving" by Jiren Yuan et al. In some latch circuits, a bipolar transistor and a constant current source are combined. However, a disadvantage of such latch circuits is that this configuration causes a current to always flow, and is not suitable for application which requires low power consumption such as portable terminal.

Some latch circuits, called inverter type, do not use a constant current source. FIG. 1 is a circuit diagram of a conventional inverter-type latch circuit, and FIG. 2 is a schematic of output waveforms of the conventional latch circuit shown in FIG. 1. The conventional latch circuit 2200 includes an input-timing-control MOS transistor 2201, a first input transistor 2202, a second input transistor 2203, and a pair of CMOS inverter circuits 1704 and 1705. The input-timing-control MOS transistor 2201, the first input transistor 2202, and the second input transistor 2203 are MOS transistors.

When a clock signal CK is input into the data input-timing-control MOS transistor 2201 and the clock signal CK transits from a relatively low potential level (hereinafter, "L level") to a relatively high potential level (hereinafter, "H level"), if input data D of the first input transistor 2202 is at L level and input data DX of the second input transistor 2203 is at H level, output data Q of the second inverter circuit 1705, which is connected to the second input transistor 2203, gets to be at L level. The input data DX corresponds to inverted data of the data D.

At the same time, input data of the first inverter circuit 1704 connected to the first input transistor 2202 gets to be at L level, and therefore, output data QX of the first inverter circuit 1704 gets to be at H level. The output data QX corresponds to inverted data of the data Q. This state is maintained after the clock signal CK transits to L level until it transits to H level again.

When the clock signal CK transits to H level, the input data D is at H level and the input data DX is at L level, and therefore, the output data QX of the first inverter circuit 1704 gets to be at L level. At the same time, the input data of the second inverter circuit 1705 gets to be at L level, and therefore, the output data Q of the second inverter circuit 1705 gets to be at H level. This state is maintained until the clock signal CK transits from L level to H level next time.

However, the conventional latch circuit 2200 has some problems. In the conventional latch circuit 2200, the output data Q (or QX) of one inverter circuit 2204 (or 2205) transits from H level to L level, and then, the output data QX (or Q) transits from L level to H level due to the inverting operation of the other inverter circuit 1705 (or 1704). Therefore, as shown in FIG. 23, there is a time delay t between the timing of the transition from L level to H level and the timing of the transition from H level to L level. A problem is that a phase difference by one stage of inverter circuit in the latch circuit 2200 occurs between the output data Q and the output data QX. Further, another problem is that the duty ratios of the output data Q and QX are shifted from 50%, and fast operation or highly accurate phase generation is prevented.

There is still another problem. Even when such latch circuit 2200 is used to configure the 4-phase clock generator, it is difficult to accurately set the phase difference of the 4-phase clock signals at 90 degree, and unwanted components cannot be eliminated completely by the IQ receiving method. Consequently, the reception characteristics deteriorate.

SUMMARY OF THE INVENTION

It is an object of the present invention to at least solve the problems in the conventional technology.

According to one aspect of the present invention, a latch circuit includes a data reading unit that reads both a first input data and a second input data, and outputs both a first output data and a second output data based on both the first input data and the second input data, and a data holding unit that holds both the first output data and the second output data. Both the first input data and the second input data are differential signals, both the first output data and the second output data are differential signals that have phases that are inverted, the latch circuit operates based on a clock signal that is supplied from an outside source, and both the data reading unit and the data holding unit are voltage driven type.

According to another aspect of the present invention, a 4-phase clock generator includes a first latch circuit that operates based on a clock signal supplied from an outside source, and includes a first data reading unit and a first data holding unit; and a second latch circuit that operates based on the clock signal, and includes a second data reading unit and a second data holding unit. The first data reading unit reads both a first input data and a second input data that are output from the second latch circuit via a first connection node and a second connection node, respectively, and outputs both a first output data and a second output data, based on both the first input data and the second input data, to the second latch circuit via a third connection node and a fourth connection node, respectively. The second data reading unit reads both a third input data and a fourth input data that are output from the first latch circuit via the third connection node and the fourth connection node, respectively, and outputs both a third output data and a fourth output data, based on both the third input data and the fourth input data, to the first latch circuit via the second connection node and the first connection node, respectively. The first output data corresponds to the third input data, the second output data corresponds to the fourth input data, the third output data corresponds to the second input data, and the fourth output data corresponds to the first input data. Both the first input data and the second input data are differential signals, and both the third input data and the fourth input data are differential signals. Both the first output data and the second output data are differential signals that have phases that are inverted, and both the third output data and the fourth output data are differential signals that have phases that are inverted. The first data holding unit holds both the first output data and the second output data, and the second data holding unit holds both the third output data and the fourth output data. Moreover, 4-phase signals that have phases that are shifted by 90 degree are output via the first connection node, the second connection node, the third connection node, and the fourth connection node.

According to still another aspect of the present invention, a receiving circuit includes a 4-phase clock generator, and an analog-digital (A/D) converter. The 4-phase clock generator includes a first latch circuit that operates based on a clock signal supplied from an outside source, and includes a first data reading unit and a first data holding unit; and a second latch circuit that operates based on the clock signal, and includes a second data reading unit and a second data holding unit. The first data reading unit reads both a first input data and a second input data that are output from the second latch circuit via a first connection node and a second connection node, respectively, and outputs both a first output data and a second output data, based on both the first input data and the second input data, to the second latch circuit via a third connection node and a fourth connection node, respectively. The second data reading unit reads both a third input data and a fourth input data that are output from the first latch circuit via the third connection node and the fourth connection node, respectively, and outputs both a third output data and a fourth output data, based on both the third input data and the fourth input data, to the first latch circuit via the second connection node and the first connection node, respectively. The first output data corresponds to the third input data, the second output data corresponds to the fourth input data, the third output data corresponds to the second input data, and the fourth output data corresponds to the first input data. Both the first input data and the second input data are differential signals, and both the third input data and the fourth input data are differential signals. Both the first output data and the second output data are differential signals that have phases that are inverted, and both the third output data and the fourth output data are differential signals that have phases that are inverted. The first data holding unit holds both the first output data and the second output data, and the second data holding unit holds both the third output data and the fourth output data. A first signal, a second signal, a third signal, and a fourth signal are output via the fourth connection node, the third connection node, the first connection node, and the second connection node, the second signal has phase that is shifted by 180 degree with respect to the first signal, the third signal has phase that is shifted by 90 degree with respect to the first signal, and the fourth signal has phase that is shifted by 270 degree with respect to the first signal. The A/D converter outputs desired digital signals based on a RF signal that is input to the receiving circuit, the first signal, the second signal, the third signal, and the fourth signal.

The other objects, features, and advantages of the present invention are specifically set forth in or will become apparent from the following detailed description of the invention when read in conjunction with the accompanying drawings.

DETAILED DESCRIPTION

Exemplary embodiments according to the present invention will be explained below in detail with reference to the accompanying drawings. In each embodiment, like numerals are denoted to like constituents, and explanation thereof will be omitted. A P-channel MOS transistor and an N-channel MOS transistor will be denoted as PMOS and NMOS, respectively.

Figure 1:
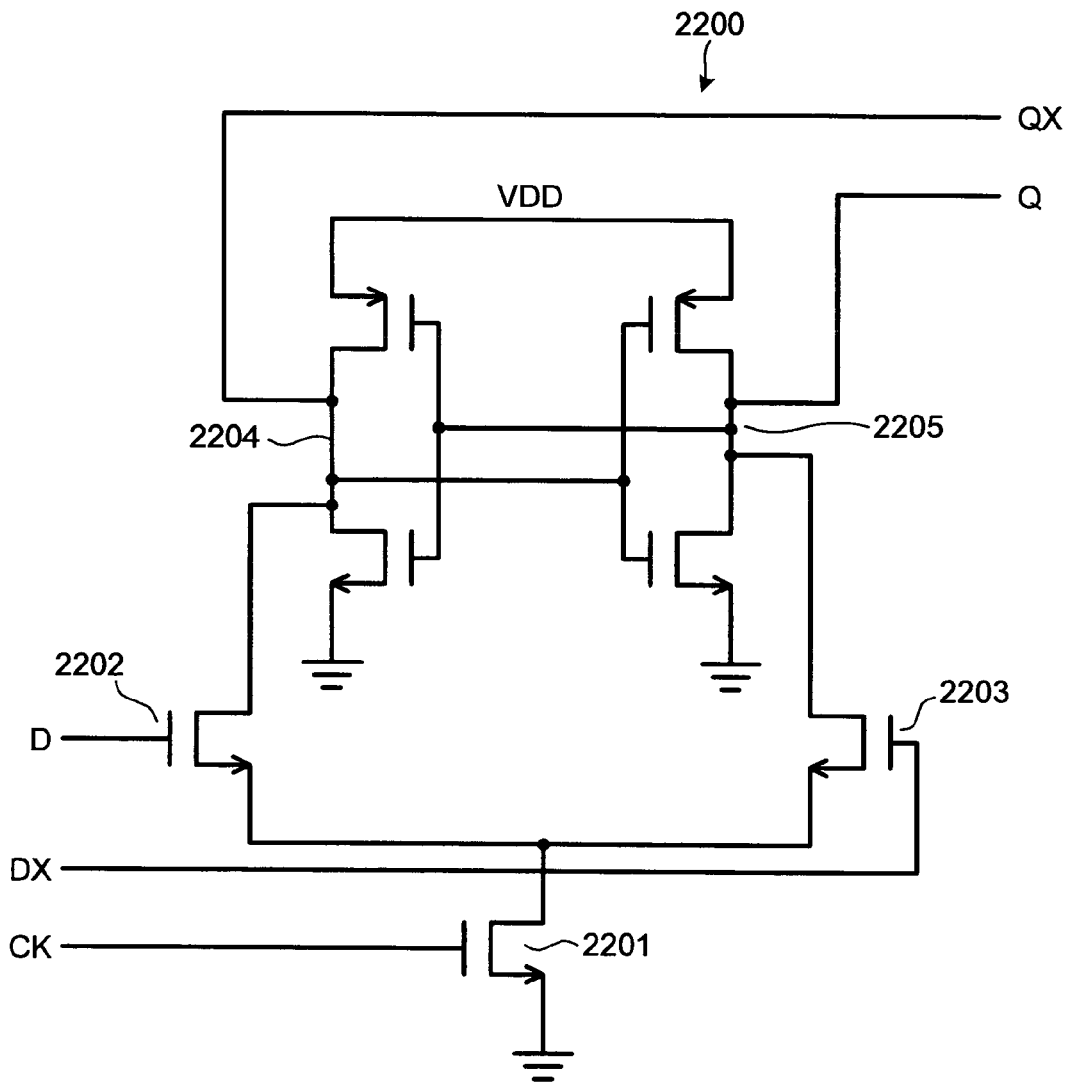
FIG. 1 is a circuit diagram of a conventional latch circuit.
Figure 2:
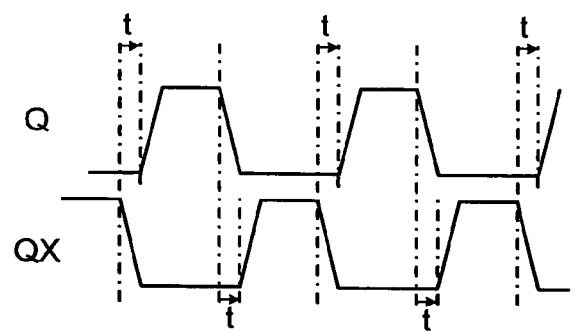
FIG. 2 is a schematic of output waveforms of the conventional latch circuit shown in FIG. 1.
Figure 3:
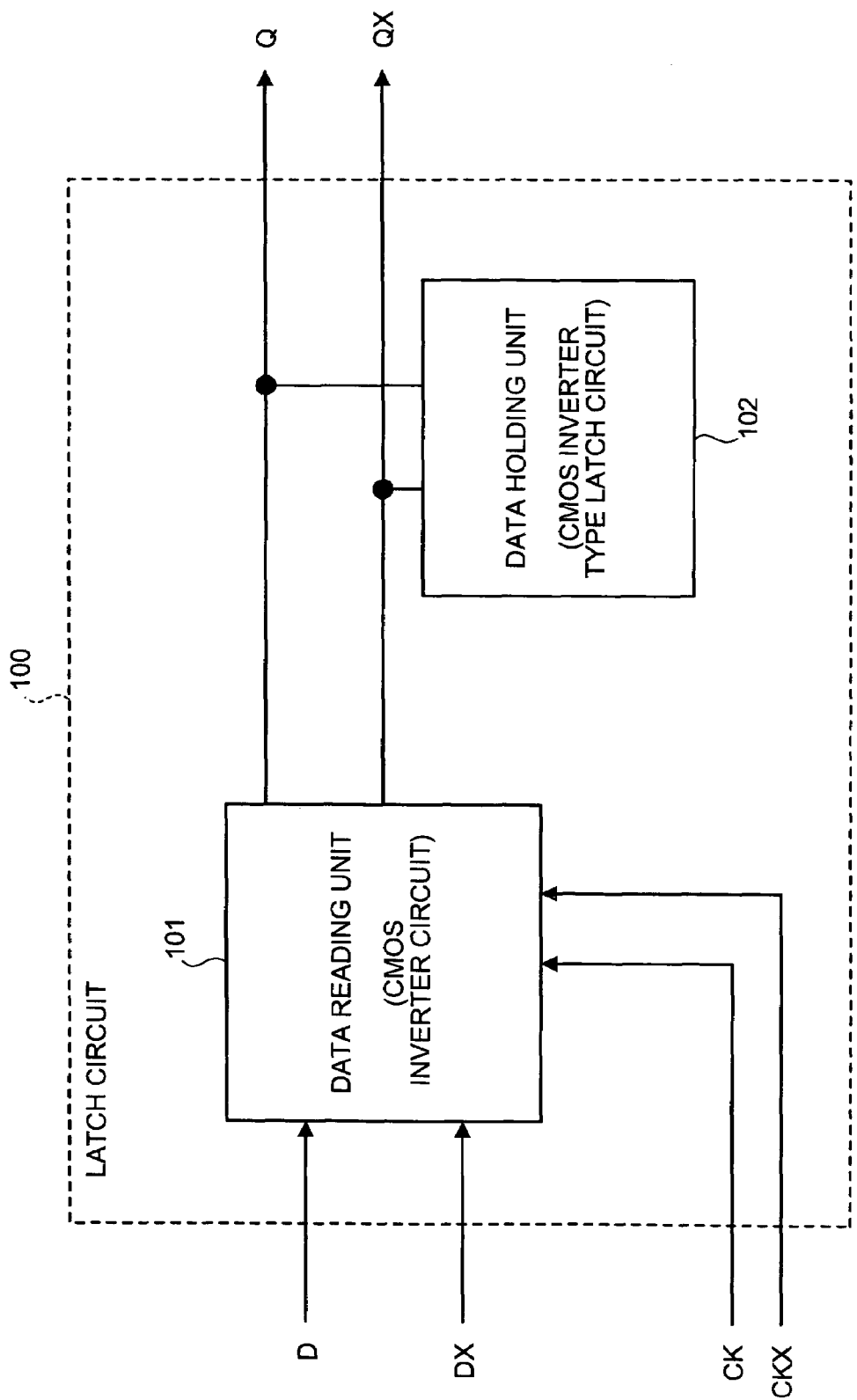
FIG. 3 is a block diagram of a latch circuit according to a first embodiment of the present invention.

FIG. 3 is a block diagram of a latch circuit 100 according to a first embodiment. The latch circuit 100 includes a data reading unit 101 composed of a CMOS inverter circuit and a data holding unit 102 composed of a CMOS-inverter-type latch circuit.

Input data of the data reading unit 101 are Input data D, input data DX having phase that is shifted by 180 degree for the input data D, a clock signal CK, and a clock signal CKX having phase that is shifted by 180 degree for the clock signal CK. When the clock signal CK is in H state and the clock signal CKX is in L state, the data reading unit 101 transmits the changes of the input data D and DX to the output data Q and QX and DX. While the clock signal CK is in L state and the clock signal CKX is in H state, even if the input data D and DX changes, the data reading unit 101 does not change the output data Q and QX. In the latter case, the data reading unit 101 changes the output data Q and QX in synchronization with rise timings of the next clock signals CK and CKX.

The data holding unit 102 holds the output data Q and QX output from the data reading unit 101. In a 2-frequency-divider that uses such latch circuits at two stages to connect mutual input/output, the data reading unit 101 outputs the output data Q having phase that is shifted by 90 degree for the input data D and the output data QX having phase that is shifted by 90 degree for the input data DX.

Figure 4:
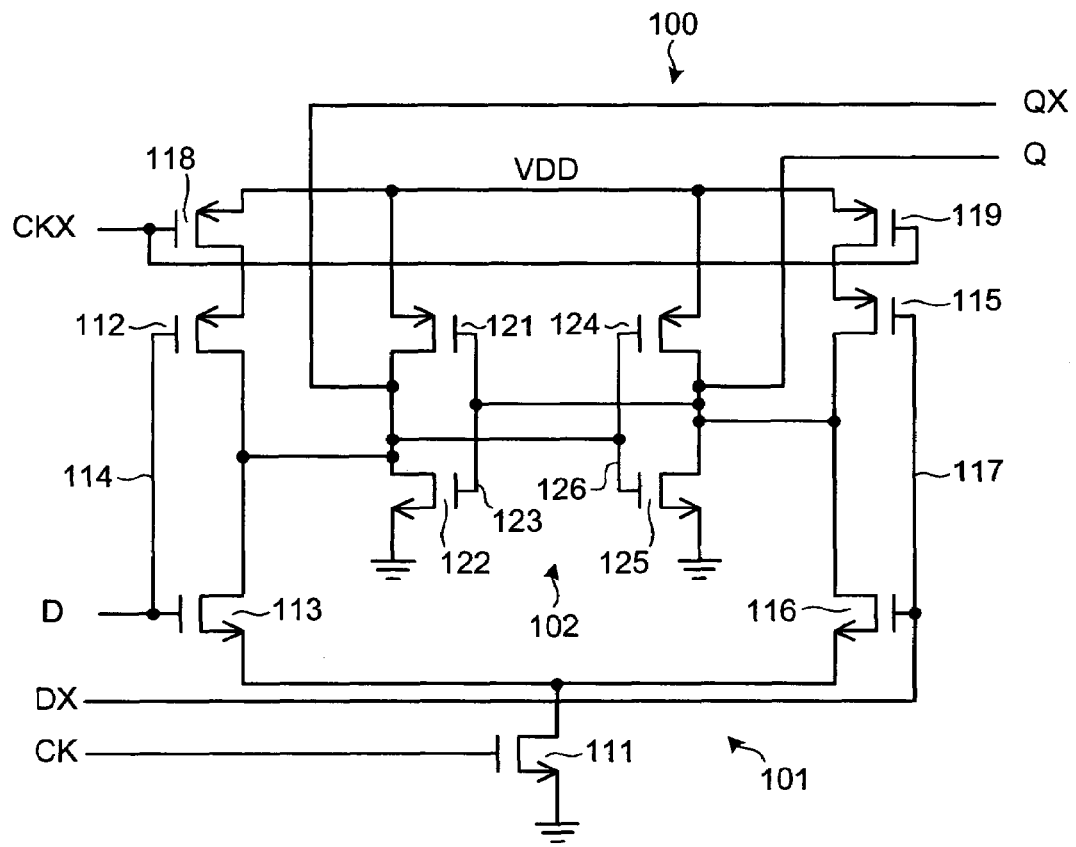
FIG. 4 is a circuit diagram of the latch circuit shown in FIG. 3.

FIG. 4 is a circuit diagram of the latch circuit 100 according to the first embodiment of the present invention. The data reading unit 101 includes a timing control NMOS 111, a first inverter circuit 114 composed of a first PMOS 112 and a first NMOS 113, a second inverter circuit 117 composed of a second PMOS 115 and a second NMOS 116, a first inverter control PMOS 118 that controls the first PMOS 112 of the first inverter circuit 114, and a second inverter control PMOS 119 that controls the second PMOS 115 of the second inverter circuit 117.

The data holding unit 102 includes a third inverter circuit 123 composed of a third PMOS 121 and a third NMOS 122, and a fourth inverter circuit 126 composed of a fourth PMOS 124 and a fourth NMOS 125.

The clock signal CK is input into a gate of the timing control NMOS 111. A source of the timing control NMOS 111 is grounded. A drain of the timing control NMOS 111 is connected to each source of the first NMOS 113 and the second NMOS 116. A drain of the first NMOS 113 is connected to a drain of the first PMOS 112.

The input data D is input into each gate of the first NMOS 113 and the first PMOS 112. A source of the first PMOS 112 is connected to a drain of the first inverter control PMOS 118. The clock signal CKX is input into a gate of the first inverter control PMOS 118. A source of the first inverter control PMOS 118 is connected to a power supply VDD.

A drain of the second NMOS 116 is connected to a drain of the second PMOS 115. The input data DX is input into each gate of the second NMOS 116 and the second PMOS 115. A source of the second PMOS 115 is connected to a drain of the second inverter control PMOS 119. The clock signal CKX is input into a gate of the second inverter control PMOS 119. A source of the second inverter control PMOS 119 is connected to the power supply VDD.

A connection node between the drain of the first PMOS 112 and the drain of the first NMOS 113 is connected to a connection node between a drain of the third PMOS 121 and a drain of the third NMOS 122, and to each gate of the fourth PMOS 124 and the fourth NMOS 125. The output data QX is output from the connection node between the drain of the third PMOS 121 and the drain of the third NMOS 122.

On the other hand, a connection node between the drain of the second PMOS 115 and the drain of the second NMOS 116 is connected to a connection node between a drain of the fourth PMOS 124 and a drain of the fourth NMOS 125, and to each gate of the third PMOS 121 and the third NMOS 122.

The output data Q is output from the connection node between the drain of the fourth PMOS 124 and the drain of the fourth NMOS 125. Each source of the third PMOS 121 and the fourth PMOS 124 is connected to the power supply VDD. Each source of the third NMOS 122 and the fourth NMOS 125 is grounded.

Each transistor size of the first PMOS 112, the first NMOS 113, the second PMOS 115, and the second NMOS 116 is adjusted such that each potential level of the output data Q and the output data QX transits at the same time when reading the input data D and DX and each rise time and each fall time thereof are equal to each other. The first inverter control PMOS 118 and the second inverter control PMOS 119 may be integrally structured similarly to the timing control NMOS 111.

Figure 5:
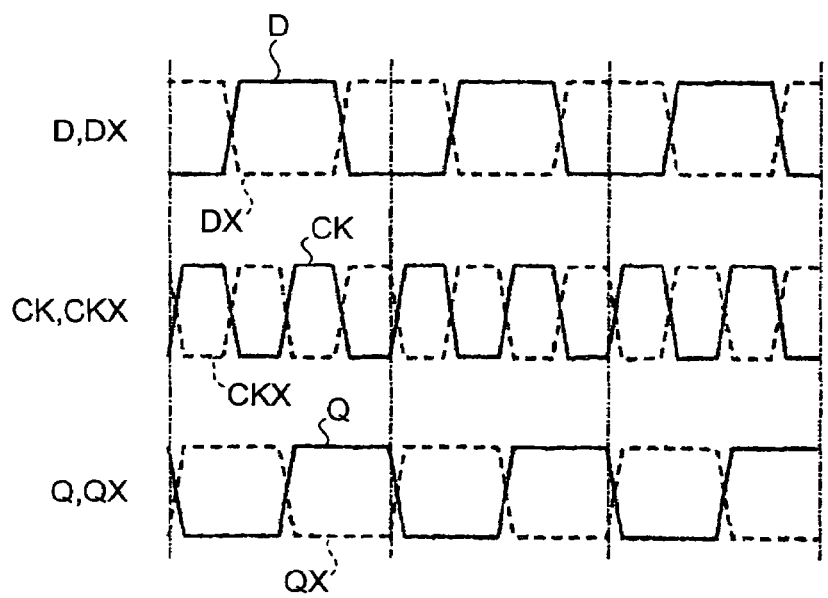
FIG. 5 is a schematic of input/output waveforms of the latch circuit shown in FIG. 3.

FIG. 5 is a schematic of input/output waveforms of the latch circuit 100 shown in FIG. 4. When the clock signal CK transits from L level to H level, the timing control NMOS 111 changes from OFF state to ON state. Since the clock signal CKX transits from H level to L level, the first inverter control PMOS 118 and the second inverter control PMOS 119 change from OFF state to ON state.

At this time, for example, if the input data D is at L level and the input data DX is at H level, the first PMOS 112 is in ON state and the first NMOS 113 is in OFF state in the first inverter circuit 114. Thus, the output of the first inverter circuit 114 is at H level and the output data QX is at H level. On the other hand, the second NMOS 116 is in ON state and the second PMOS 115 is in OFF state in the second inverter circuit 117. Thus, the output of the second inverter circuit 117 is at L level and the output data Q is at L level.

Since the input of the third inverter circuit 123 is at L level, the output of the third inverter circuit 123, that is, the output data QX is maintained at H level. Similarly, since the input of the fourth inverter circuit 126 is at H level, the output of the fourth inverter circuit 126, that is, the output data Q is maintained at L level. In other words, the input data D and DX are latched in the data holding unit 102.

This state is held until the clock signal CK transits again to H level (the clock signal CKX is at L level) after the clock signal CK gets to be at L level and the timing control NMOS 111 gets to be in OFF state and simultaneously the clock signal CKX gets to be at H level and the first inverter control PMOS 118 and the second inverter control PMOS 119 get to be in OFF state.

When the timing control NMOS 111, the first inverter control PMOS 118, and the second inverter control PMOS 119 are in OFF state, the source of each transistor is in floating state. Therefore, since the first inverter circuit 114 and the second inverter circuit 117 do not operate in this state, even when the level of the input data D or the input data DX changes, the data reading unit 101 does not read the change. In other words, the output data Q and QX and the latched data do not change.

When the clock signal CK transits again from L level to H level, the timing control NMOS 111 changes from OFF state to ON state. Further, the clock signal CKX transits from H level to L level, and the first inverter control PMOS 118 and the second inverter control PMOS 119 change from OFF state to ON state. At this time, the input data D is at H level and the input data DX is at L level.

Therefore, the first PMOS 112 changes from ON state to OFF state and the first NMOS 113 changes from OFF state to ON state in the first inverter circuit 114. Thus, the output of the first inverter circuit 114 changes to L level and the output data OX immediately changes from H level to L level.

On the other hand, the second NMOS 116 changes from ON state to OFF state and the second PMOS 115 changes from OFF state to ON state in the second inverter circuit 117. Thus, the output of the second inverter circuit 117 changes to H level and the output data Q immediately changes from L level to H level. Since the input of the third inverter circuit 123 is at H level, the output of the third inverter circuit 123, that is, the output data OX is maintained at L level.

Similarly, since the input of the fourth inverter circuit 126 is at L level, the output of the fourth inverter circuit 126, that is, the output data Q is maintained at H level. Thereafter, each time the clock signal CK transits from L level to H level, the potential levels of the output data Q and QX are repeatedly inverted.

According to the first embodiment, the data reading unit 101 reads the input data D and DX, and outputs the output data Q and the output data QX at the same time. The output data Q and the output data QX can be set such that the rise time and the fall time thereof are equal to each other. Therefore, it is possible to prevent a phase difference by one stage of the inverter circuit from occurring between the output data Q and the output data QX. Further, it is possible to prevent the duty ratios of the output data Q and QX from shifting from 50%.

Figure 6:
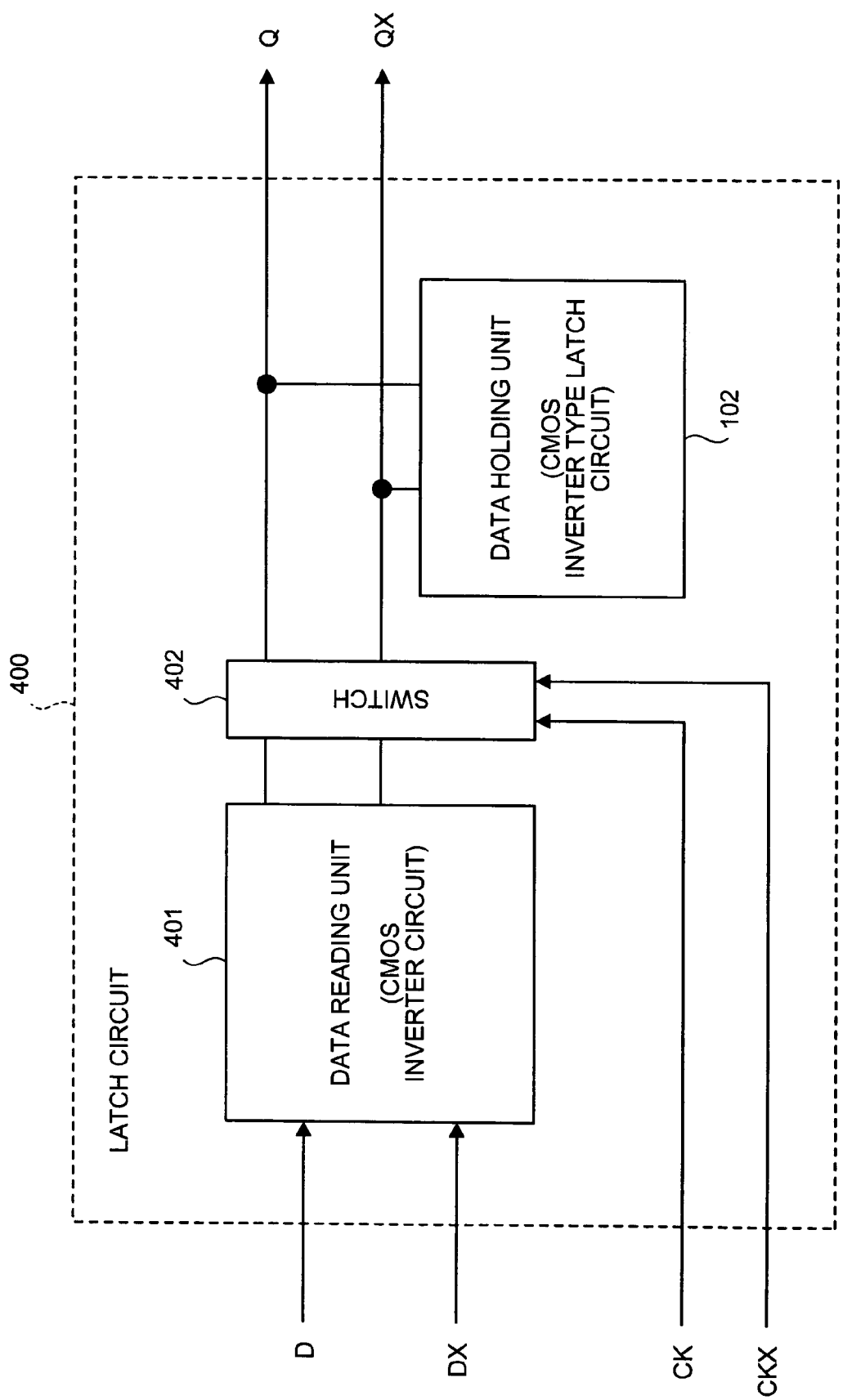
FIG. 6 is a block diagram of a latch circuit according to a second embodiment of the present invention.

FIG. 6 is a block diagram of a latch circuit 400 according to a second embodiment. In the latch circuit 400, a data reading unit 401 outputs the output data Q and QX to the outside of the latch circuit 400 via a switch 402 while the data holding unit 102 holds the output data Q and QX.

The switch 402 is controlled in its opening/closing based on the clock signals CK and CKX. Though not particularly limited, in the example shown in FIG. 6, the clock signals CK and CKX are not supplied to the data reading unit 401. The data reading unit 401 is corresponding to the data reading unit 101 in the latch circuit 100 shown in FIG. 3, and since, as described later, transfer gates 421 and 422 have functions of the first and second inverter control PMOS 118 and 119 provided in the first embodiment, the first and second inverter control PMOS 118 and 119 maybe omitted. Moreover, the data reading unit 401 may be configured to have the same structure as the data reading unit 101 in the latch circuit 100 to add a function of adjusting timing, which is described later. Other configuration is identical to the configuration of the latch circuit 100 shown in FIG. 3.

Figure 9:
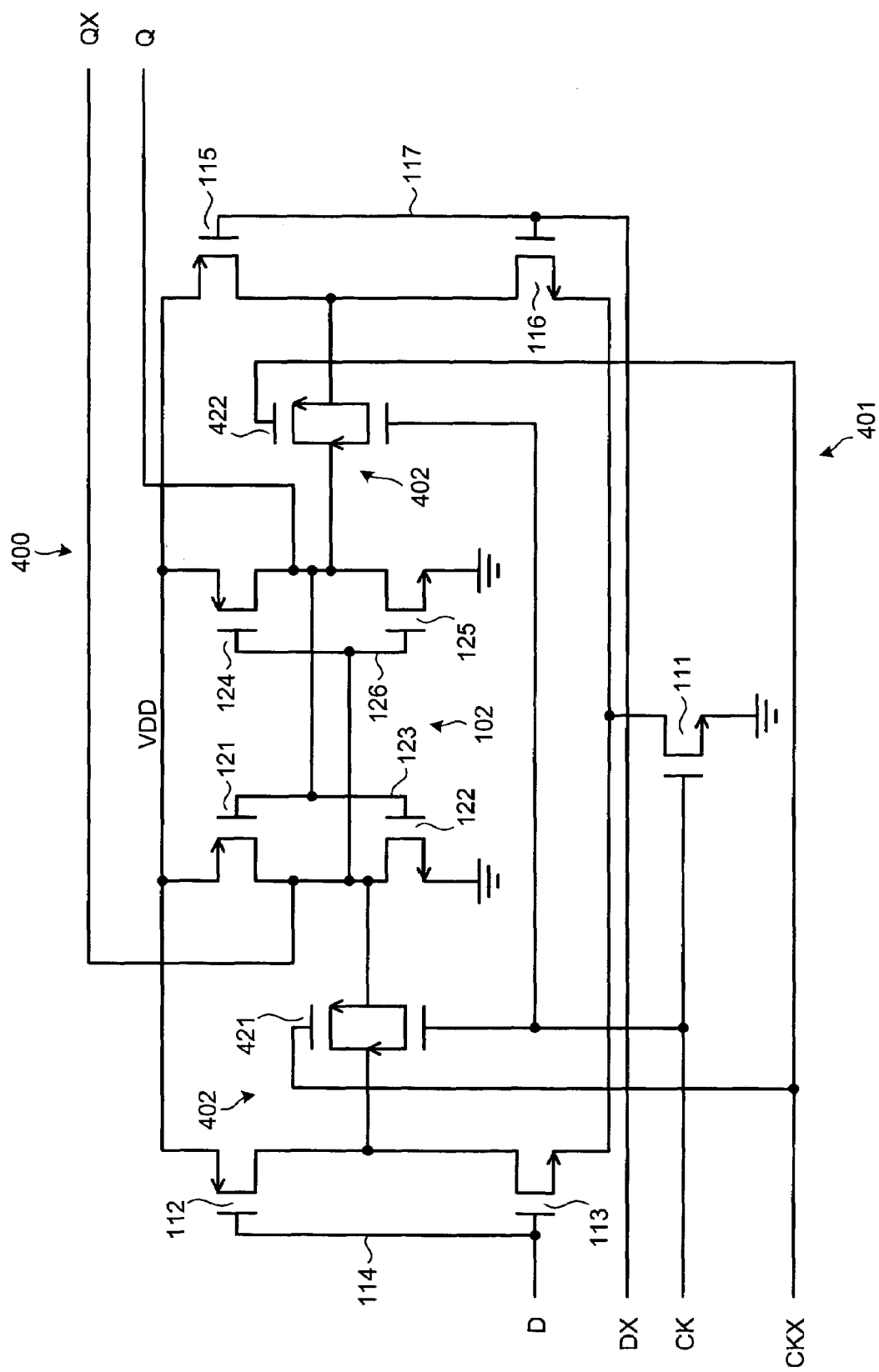
FIG. 9 is a circuit diagram of another latch circuit according to the second embodiment.

FIG. 9 is a circuit diagram of the latch circuit 400 according to the second embodiment. The transfer gate 421 is connected between an output node of the first inverter circuit 114 and an input node of the fourth inverter circuit 126 (an output node of the third inverter circuit 123).

The transfer gate 422 is connected between an output node of the second inverter circuit 117 and an input node of the third inverter circuit 123 (an output node of the fourth inverter circuit 126). The transfer gates 421 and 422 include a function as the switch 402, and enter ON state when the clock signal CK is at H level (the clock signal CKX is at L level).

In other words, the transfer gates 421 and 422 enter ON state at a timing when the data reading unit 401 reads the input data D and DX. Therefore, when the clock signal CK is at H level, as explained in the first embodiment, an output signal of the first inverter circuit 114 is transferred to the input of the fourth inverter circuit 126 and is output as the output data QX. Further, an output signal of the second inverter circuit 117 is transferred to the input of the third inverter circuit 123 and is output as the output data Q.

On the other hand, when the clock signal CK is at L level (the clock signal CKX is at H level), that is, while the data holding unit 102 is latching the output data Q and QX, the transfer gates 421 and 422 are in OFF state. Therefore, even when the level of the input data D or the input data DX changes, the change is not transferred to the data holding unit 102 so that the data latched in the data holding unit 102 does not change. In this manner, in the configuration shown in FIG. 9, the transfer gates 421 and 422 include the functions of the first and second inverter control PMOS 118 and 119 and the timing control NMOS 111 provided in the first embodiment. Therefore, though not particularly limited, in the second embodiment, the first and second inverter control PMOS 118 and 119 and the timing control NMOS 111 are not provided. Other configuration is identical to the configuration shown in FIG. 4.

Figure 8:
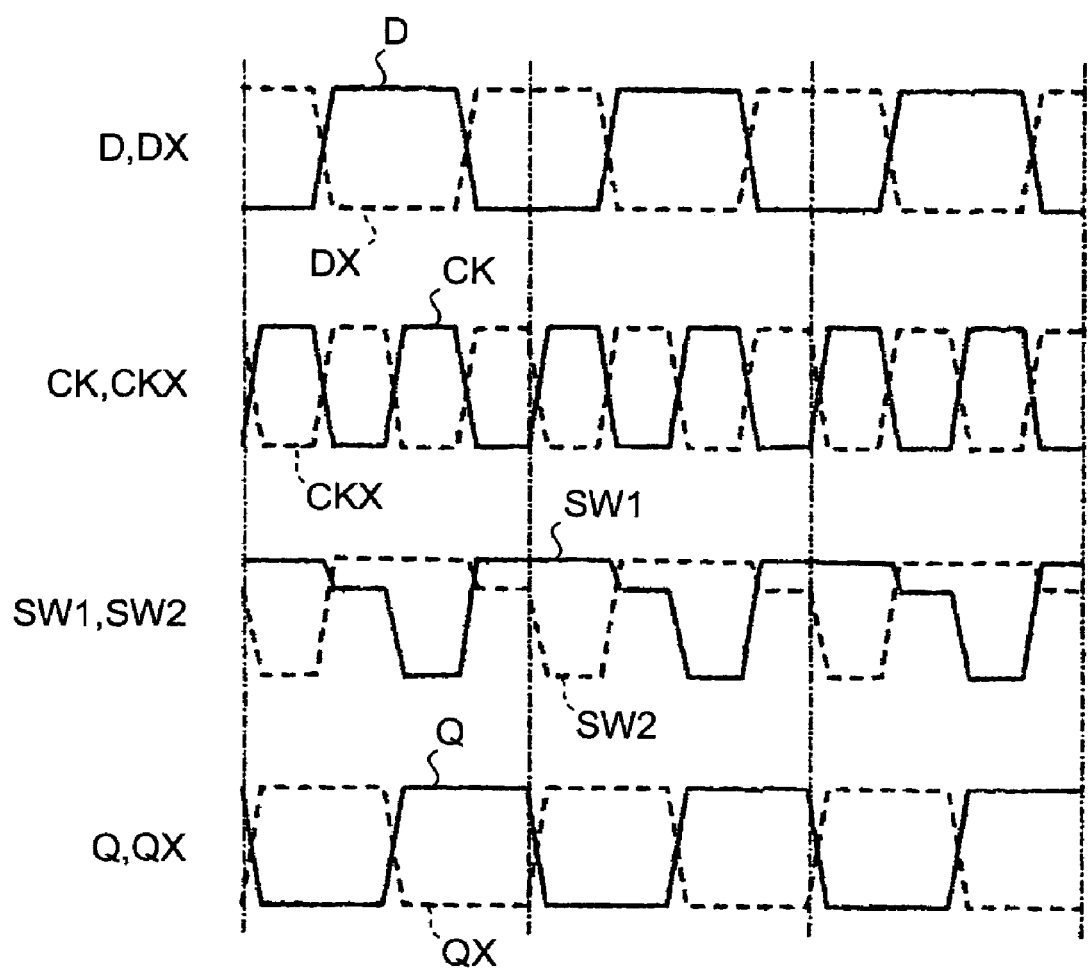
FIG. 8 is a schematic of input/output waveforms of the latch circuit shown in FIG. 6.

FIG. 8 is a schematic of input/output waveforms of the latch circuit 400 according to the second embodiment of the present invention. SW1 and SW2 are output waveforms of the first inverter circuit 114 and the second inverter circuit 117, respectively.

Figure 7:
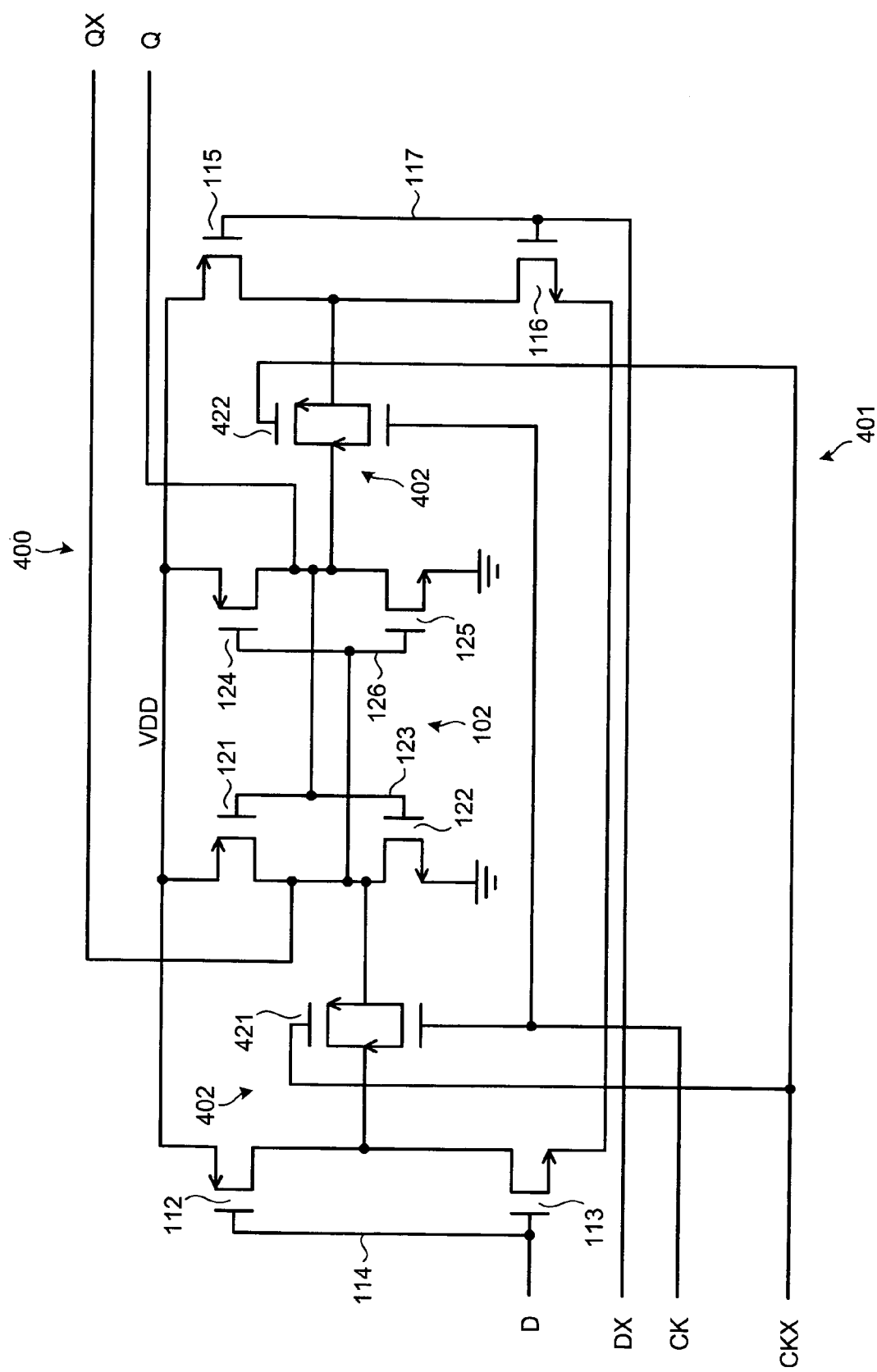
FIG. 7 is a circuit diagram of the latch circuit shown in FIG. 6.

The input level of the NMOS 111, the PMOS 118, and the PMOS 119 may be fixed. FIG. 7 is a circuit diagram of the latch circuit according to the second embodiment. By adding the NMOS 111 to be used together with the transfer gates 421 and 422, as shown in FIG. 7, in order not to flow unwanted current, it is possible to fix the input level.

According to the second embodiment, the following effect can be obtained in addition to the effect of the first embodiment. When a size of the transistor 121, 122, 124, or 125 constituting the data holding unit 102 is smaller than that of the transistor 112, 113, 115, or 116 constituting the data reading unit 401, a driving force of the transistor 121, 122, 124, or 125 constituting the data holding unit 102 is smaller than that of the transistor 112, 113, 115, or 116 constituting the data reading unit 401.

In this case, if the switch 402 is not provided, the transistors 112, 113, 115, and 116 of the data reading unit 401 are superior to the inversion function of the data holding unit 102, and the output data Q and the output data QX are made stable in the state of being in-phase output. In the second embodiment, while the data holding unit 102 is latching the data, the switch 402 gets to be in the open state, which prevents the inversion function of the data holding unit 102 from being obstructed due to the driving force of the transistors 112, 113, 115, and 116 of the data reading unit 401. Thus, it is possible to prevent the output data Q and the output data QX from being in-phase output.

Figure 10:
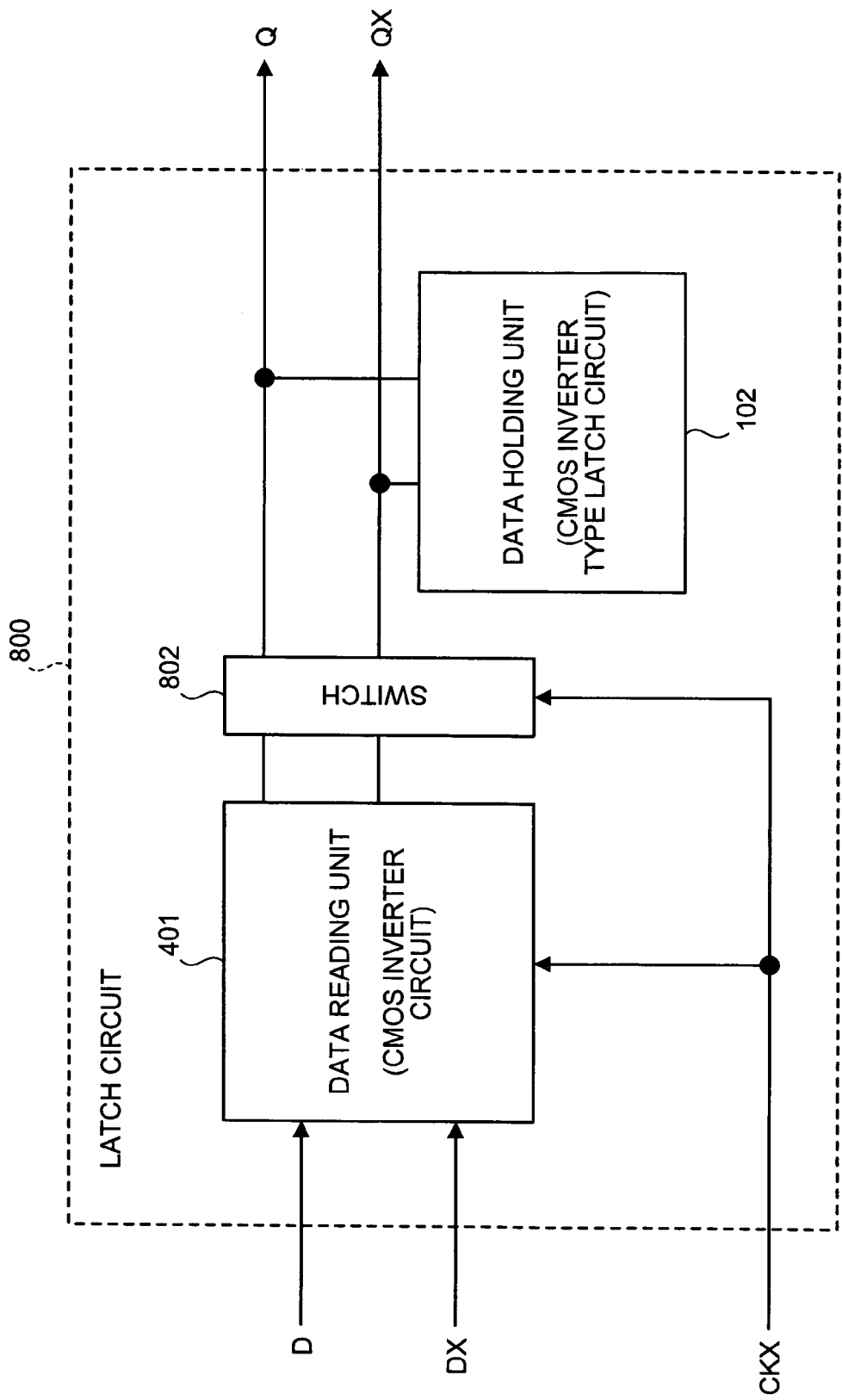
FIG. 10 is a block diagram of a latch circuit according to a third embodiment of the present invention.

FIG. 10 is a block diagram of a latch circuit 800 according to a third embodiment of the present invention. In the latch circuit 800, only the clock signal CKX is supplied to a switch 802 without the clock signal CK. The switch 802 corresponds to the switch 402 in the latch circuit 400 shown in FIG. 6. Other configuration is identical to the configuration of the latch circuit 400 shown in FIG. 6.

Figure 11:
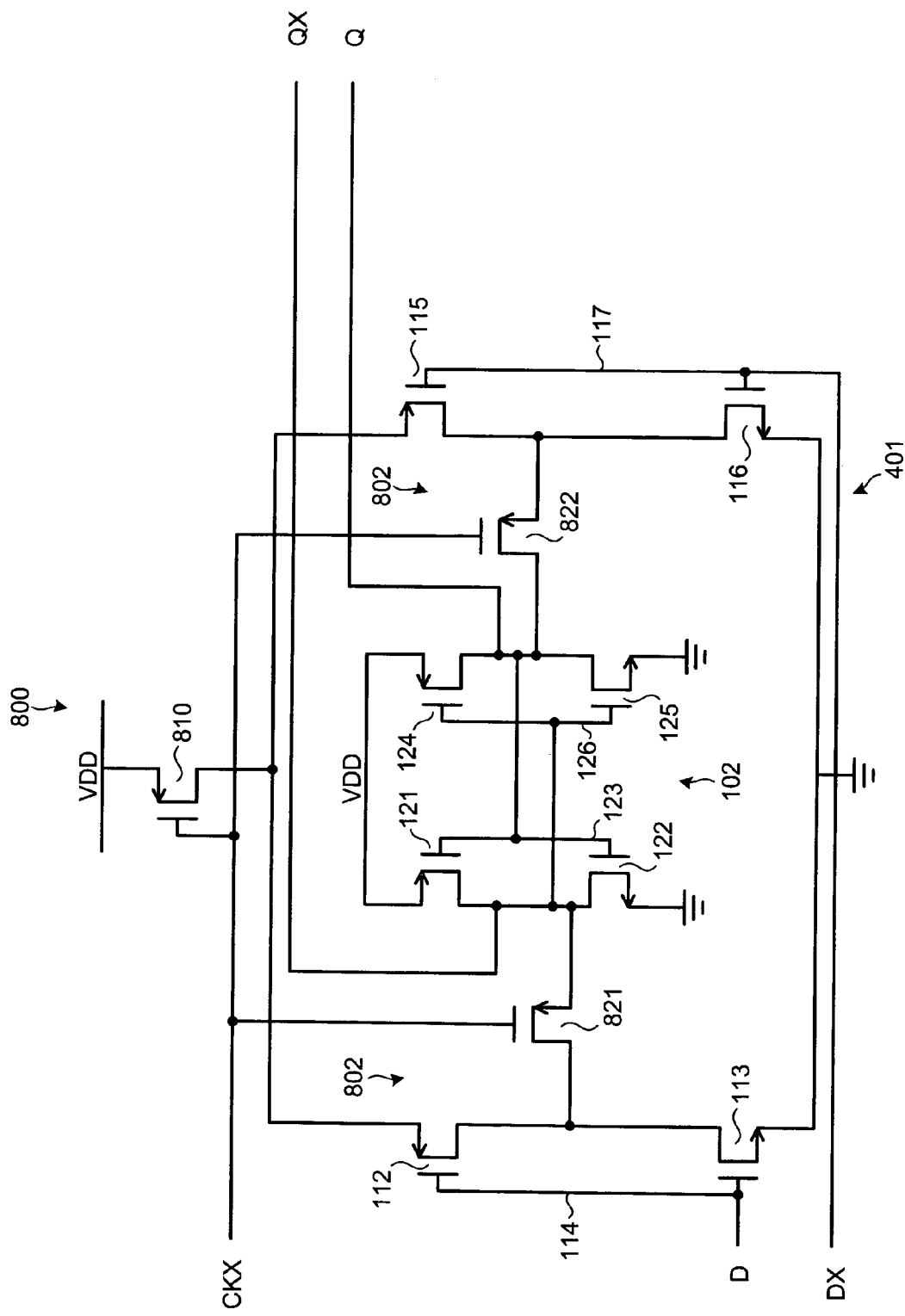
FIG. 11 is a circuit diagram of the latch circuit shown in FIG. 10.

FIG. 11 is a circuit diagram of the latch circuit 800 according to the third embodiment of the present invention. Each source of the first NMOS 113 and the second NMOS 116 is grounded. A timing control PMOS 810, which is a timing control transistor, is connected between each source of the first PMOS 112 and the second PMOS 115 and the power supply VDD. The clock signal CKX is input into a gate of the timing control PMOS 810. Thus, when the clock signal CKX transits from H level to L level, the input data D and DX are read by the data reading unit 401.

Other configuration and operation are identical to the configuration and operation shown in FIG. 9, and in the explanation thereof, the transfer gates 421 and 422 may be replaced with the PMOS 821 and 822. According to the third embodiment, the same effect as in the second embodiment can be obtained. A latch circuit having a different configuration from the latch circuit 800 may be employed. Moreover, it is possible to obtain an equivalent effect by employing the NMOS instead of the PMOS as the transfer gate to be controlled by the clock signal CK instead of the clock signal CKX.

Figure 12:
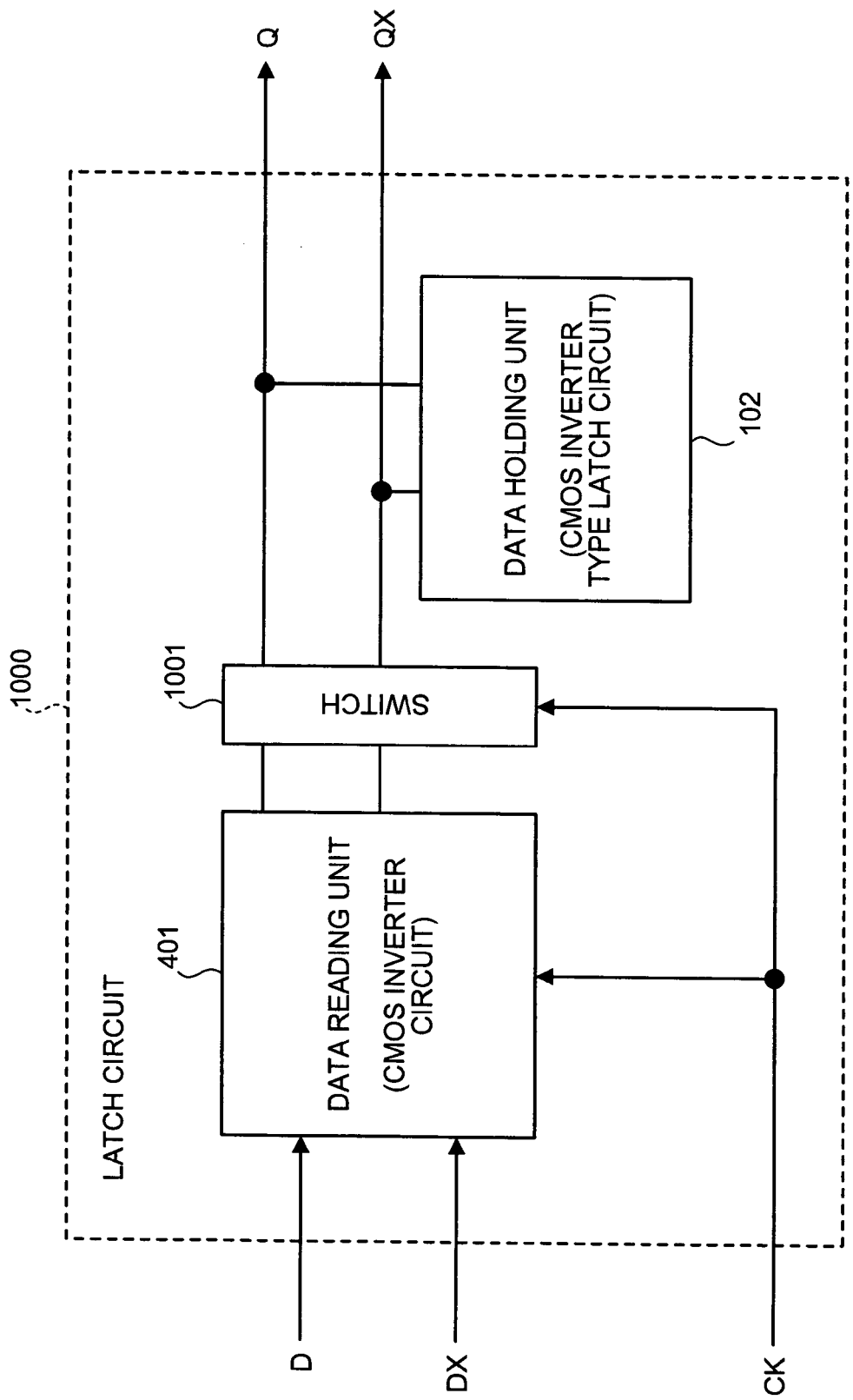
FIG. 12 is a block diagram of another latch circuit according to the third embodiment of the present invention.

A latch circuit according to the third embodiment can have another configuration. FIG. 12 is a block diagram of a latch circuit 1000 according to the third embodiment of the present invention. The latch circuit 1000 includes the data reading unit 401 similar as in the latch circuit 400 shown in FIG. 6, and a switch 1001 is composed of an NMOS. In the latch circuit 1000, the switch 1001 is controlled in its opening/closing operation based on the clock signal CK. The timing control transistor may be configured with a combination of PMOS and NMOS.

Next, a latch circuit according to a fourth embodiment of the present invention will be explained. For example, in electric home appliances, low power consumption is desired to enhance due to various reasons. Thus, many electric home appliances enter a standby state and drive only a required block, when the circuit operation is not actually required.

Since the input data D and DX are undetermined in this standby state, an unwanted current may flow depending on the potential levels. Thus, in the fourth embodiment, the output data Q and QX are fixed at desired potentials in the standby state and the reading operation of the input data D and DX is stopped, so that an unwanted current does not flow.

Figure 13:
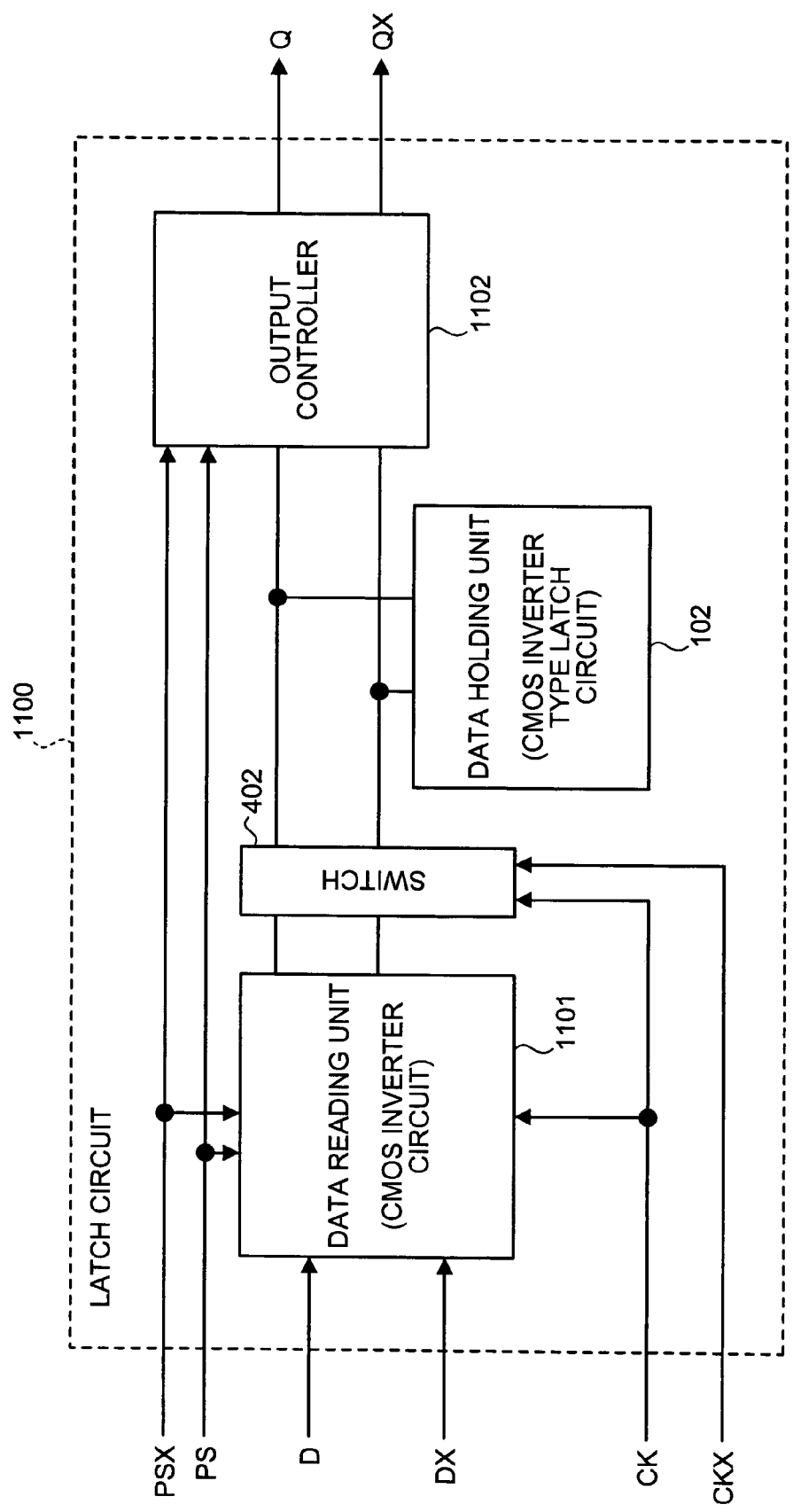
FIG. 13 is a block diagram of a latch circuit according to a fourth embodiment of the present invention.

FIG. 13 is a block diagram of a latch circuit 1100 according to the fourth embodiment of the present invention. The latch circuit 1100 is configured such that an output controller 1002 is added to the latch circuit 400 shown in FIG. 6, and specifically the latch circuit 1100 includes a data reading unit 1101 corresponding to the data reading unit 400 shown in FIG. 6, the switch 402, the data holding unit 102, and the output controller 1102.

A power save signal PS and a power save signal PSX are input into the data reading unit 1101 in addition to the input data D and DX and the clock signal CK. Phase of the power save signal PS is shifted by 180 degree for phase of the power save signal PS. The power save signals PS and PSX are asserted in the standby state and are negated in the normal operation.

The output controller 1102 forcibly fixes the potentials of the output data Q and QX, which is to be output to the outside from the data reading unit 1101 via the switch 402, at desired potentials, and stops the operation of the data reading unit 1101. Specifically, the power save signals PS and PSX are input into the output controller 1102. The output controller 1002 outputs the output data Q and QX to the outside when the power save signals PS and PSX are negated, and fixes the output data Q and QX at desired potentials when the signals are asserted.

Thus, in the fourth embodiment, the output data Q and QX of the latch circuit 1100 can be fixed at desired potentials and the operation of the data reading unit 1101 can be stopped in the standby state, thereby preventing an unwanted current from flowing.

Figure 14:
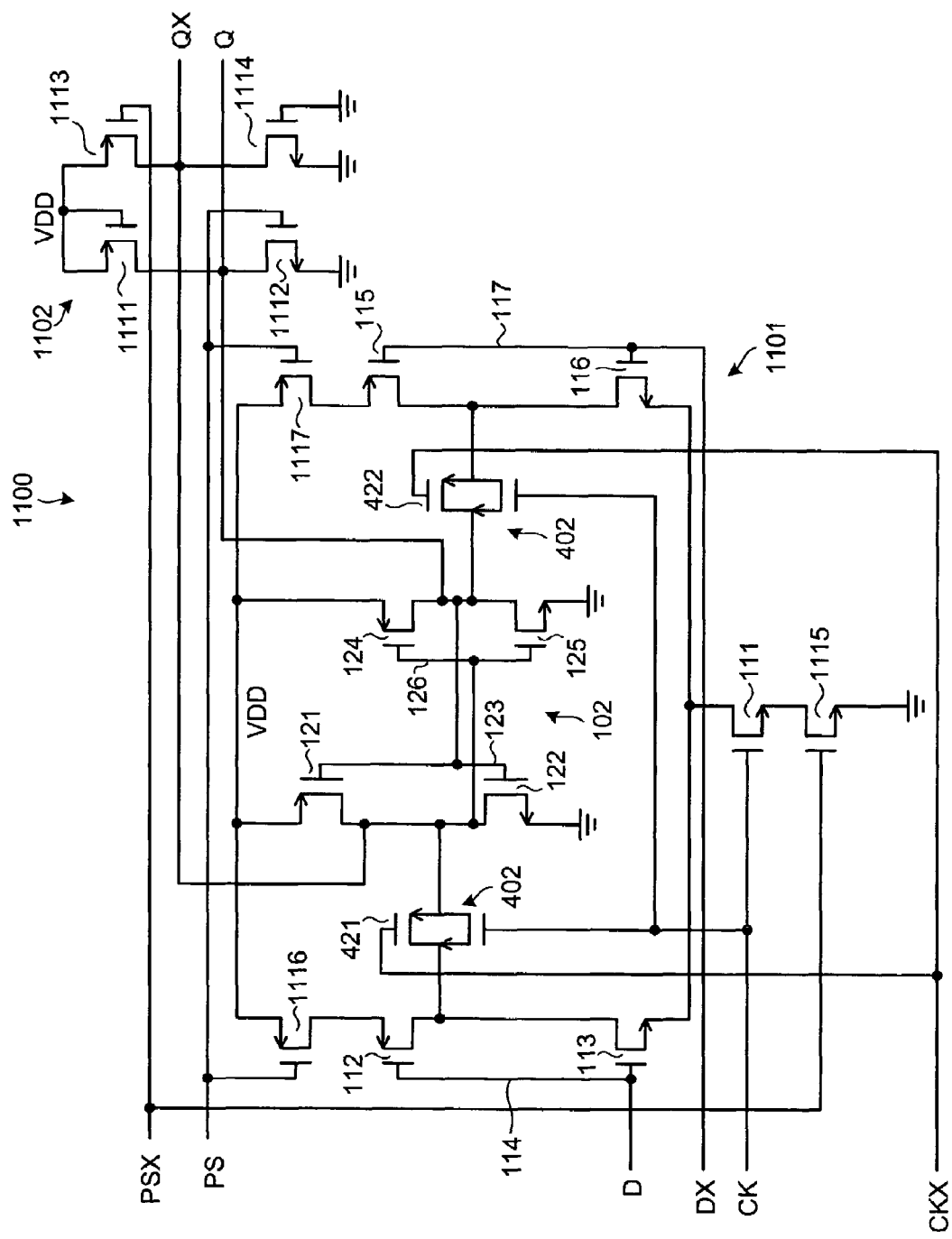
FIG. 14 is a circuit diagram of the latch circuit shown in FIG. 13.

FIG. 14 is a circuit diagram of the flip-flip circuit 1100 according to the fourth embodiment. The output controller 1102 includes four PMOS 1111, 1113, 116, and 1117 and three NMOS 1112, 1114, and 1115. As shown in FIG. 14, for convenience of explanation, the NMOS 1115 and the PMOS 1116 and 1117 are included in the data reading unit 1101 to avoid the complicated drawing.

A drain of the PMOS 1111 and a drain of the NMOS 1112 are connected to a signal line of the output data Q. A source and a gate of the PMOS 1111 are connected to the power supply VDD. A source of the NMOS 1112 is grounded, and the power save signal PS is input to a gate of the NMOS 1112. A drain of the PMOS 1113 and a drain of the NMOS 1114 are connected to a signal line of the output data QX. A source of the PMOS 1113 is connected to the power supply VDD, and the power save signal PSX is input to a gate of the PMOS 1113. A source and a gate of the NMOS 1114 are grounded.

In the standby state, the power save signal PS is at H level, the power save signal PSX is at L level, and the NMOS 1112 and the PMOS 1113 are in ON state. Thus, the potential of the signal line of the output data Q is fixed at L level, and the potential of the signal line of the output data QX is fixed at H level.

In the normal operation, that is, when the power save signal PS is at L level and the power save signal PSX is at H level, the NMOS 1112 and the PMOS 1113 are in OFF state, so that the potential of the signal line of the output data Q is equal to the potential of the output data Q, and the potential of the signal line of the output data QX is equal to the potential of the output data QX. In other words, the output data Q and QX are output to the outside.

The NMOS 1115 is connected between the source of the timing control NMOS 111 and the ground, and the power save signal PSX is input to a gate of the NMOS 1115. The PMOS 1116 is connected between the source of the first PMOS 112 and the power supply VDD, and the power save signal PS is input to a gate of the PMOS 1116. The PMOS 1117 is connected between the source of the second PMOS 115 and the power supply VDD, and the power save signal PS is input to a gate of the PMOS 1117.

Therefore, since the NMOS 1115 and the PMOS 1116 and 1117 are in OFF state in the standby state, the first inverter circuit 114 and the second inverter circuit 117 do not operate. In other words, the input data D and DX are not read in the data reading unit 1101. Further, an unwanted current does not flow through the data reading unit 1101 irrespective of the input levels of the input data D and DX.

Since the NMOS 1115 and the PMOS 1116 and 1117 are in ON state in the normal operation, the first inverter circuit 114 and the second inverter circuit 117 operate, and the input data D and DX are read in the data reading unit 1101. Other configuration and operation are identical to the configuration and operation shown in FIG. 9.

According to the fourth embodiment, the output data Q and QX of the latch circuit 1100 can be fixed at desired potentials and the operation of the data reading unit 1101 can be stopped in the standby state. Thus, in addition to the effect of the second embodiment, it is possible to obtain an effect that an abnormal current can be prevented from flowing in a power-saved state such as the standby state.

Figure 15:
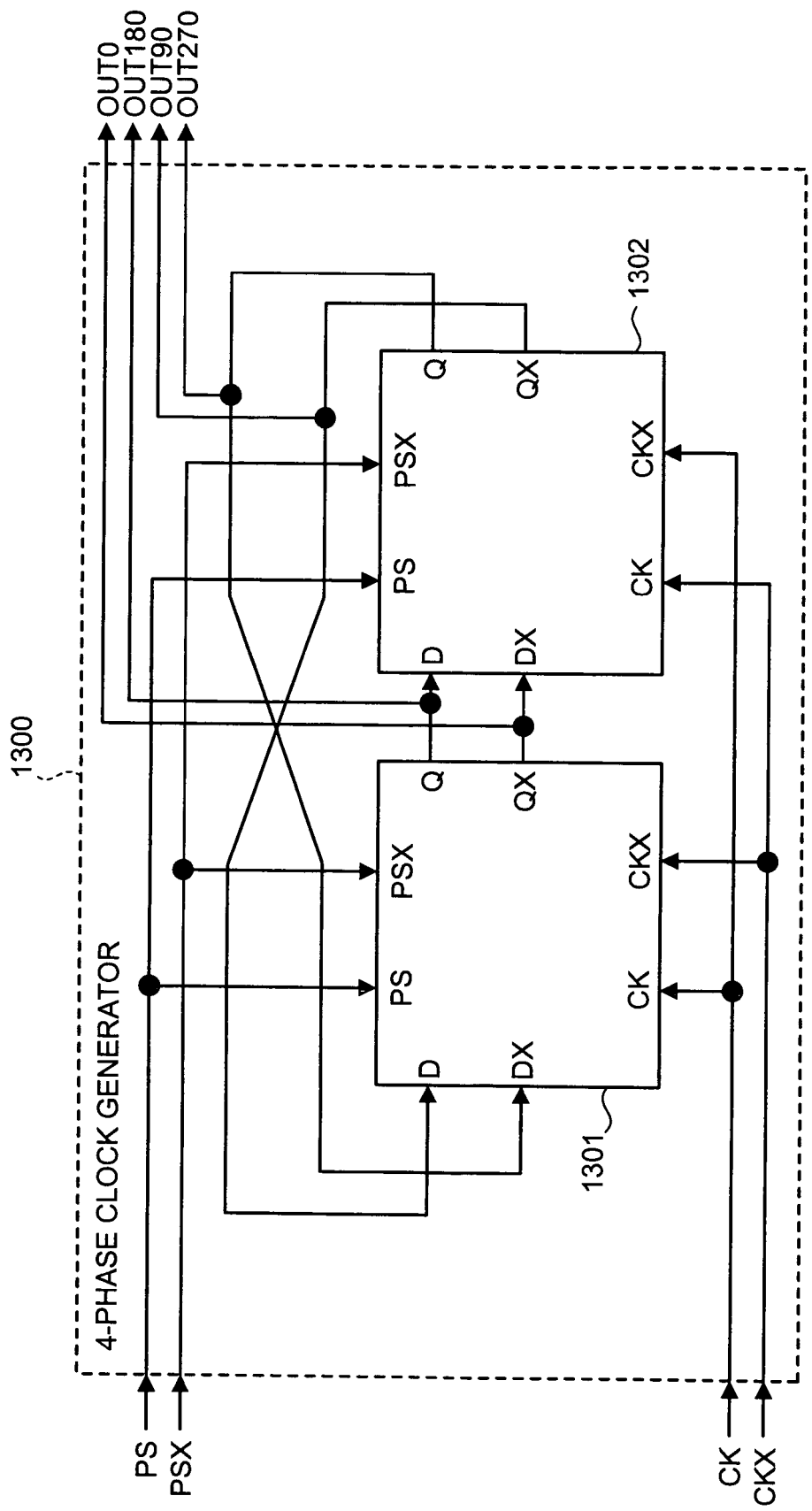
FIG. 15 is a block diagram of a 4-phase clock generator according to a fifth embodiment of the present invention.
Figure 16:
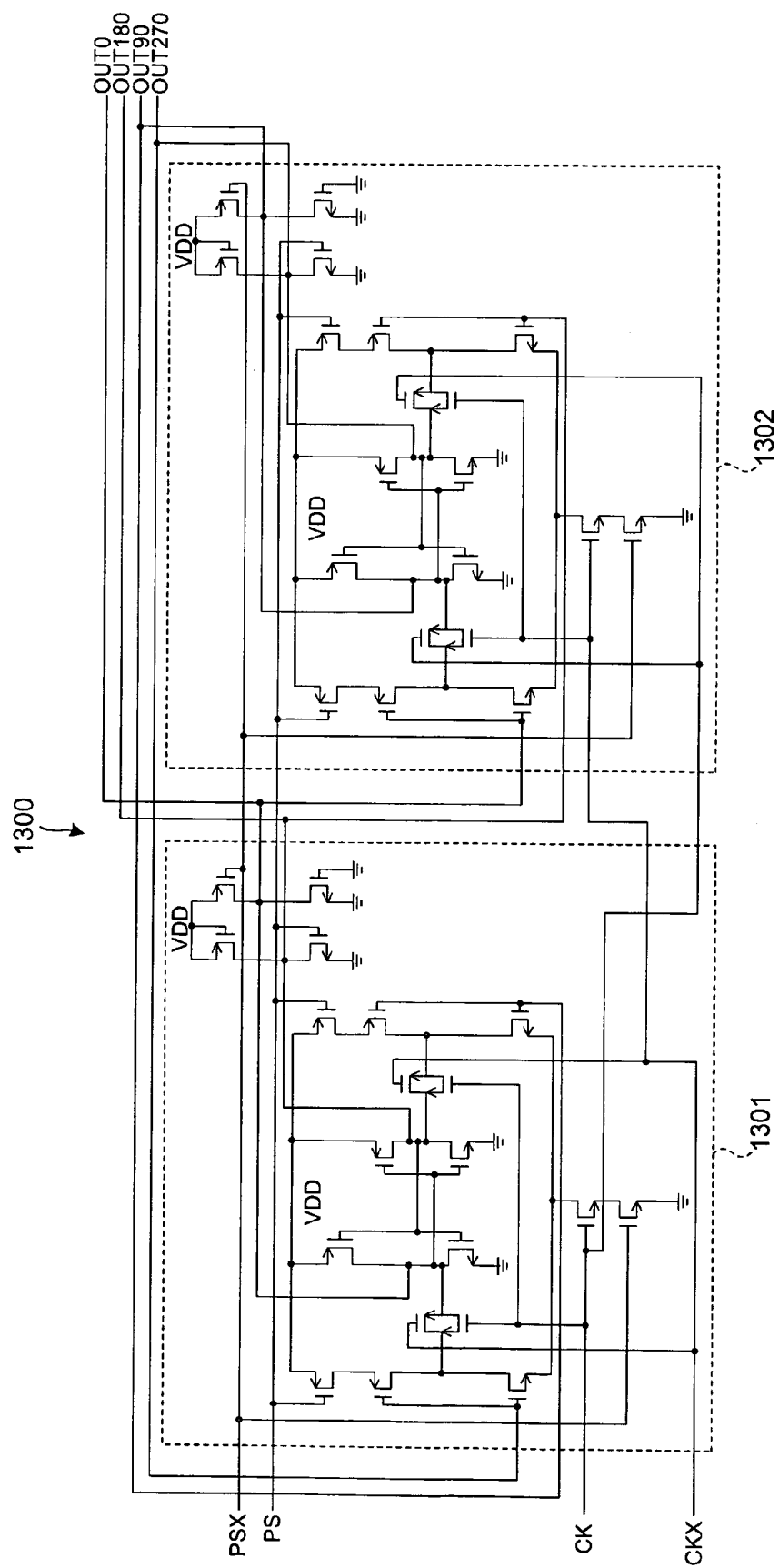
FIG. 16 is a circuit diagram of the 4-phase clock generator shown in FIG. 15.

Next, a configuration of a 4-phase clock generator according to a fifth embodiment of the present invention will be explained. The 4-phase clock generator according to the fifth embodiment is a combination of two of the latch circuits 100, 400, 800, 1000, and 1100 according to the first to fourth embodiments. As one example, a 4-phase clock generator 1300 using two latch circuits 1100 according to the fourth embodiment will be explained. FIG. 15 is a block diagram of the 4-phase clock generator 1300 according to the fifth embodiment, and FIG. 16 is a circuit diagram of the 4-phase clock generator 1300 according to the fifth embodiment.

The 4-phase clock generator 1300 includes a first latch circuit 1100 (hereinafter, "first latch circuit 1301") and a second latch circuit 1100 (hereinafter, "second latch circuit 1302).

These latch circuits are connected such that the output data Q and the output data QX of the first latch circuit 1301 are the input data D and the input data DX of the second latch circuit 1302, respectively, and the output data Q and the output data QX of the second latch circuit 1302 are the input data DX and the input data D of the first latch circuit 1301, respectively.

The clock signal CK is input into a CK terminal of the first latch circuit 1301 and a CKX terminal of the second latch circuit 1302 such that the two latch circuits 1301 and 1302 alternately read the input data D and DX. The clock signal CKX is input into a CKX terminal of the first latch circuit 1301 and a CK terminal of the second latch circuit 1302.

Assuming that the phase of data OUT0 output from a QX terminal of the first latch circuit 1301 as a reference (zero), data OUT180 having a phase that is shifted by 180 degree is output from a Q terminal of the first latch circuit 1301. Data OUT90 having a phase that is shifted by 90 degree is output from a QX terminal of the second latch circuit 1302, and data OUT270 having phase that is shifted by 270 degree is output from a Q terminal of the second latch circuit 1302. The CK terminal and the CKX terminal are clock input terminals of the latch circuits 1301 and 1302, and the Q terminal and the QX terminal are data output terminals of the latch circuits 1301 and 1302.

Figure 17:
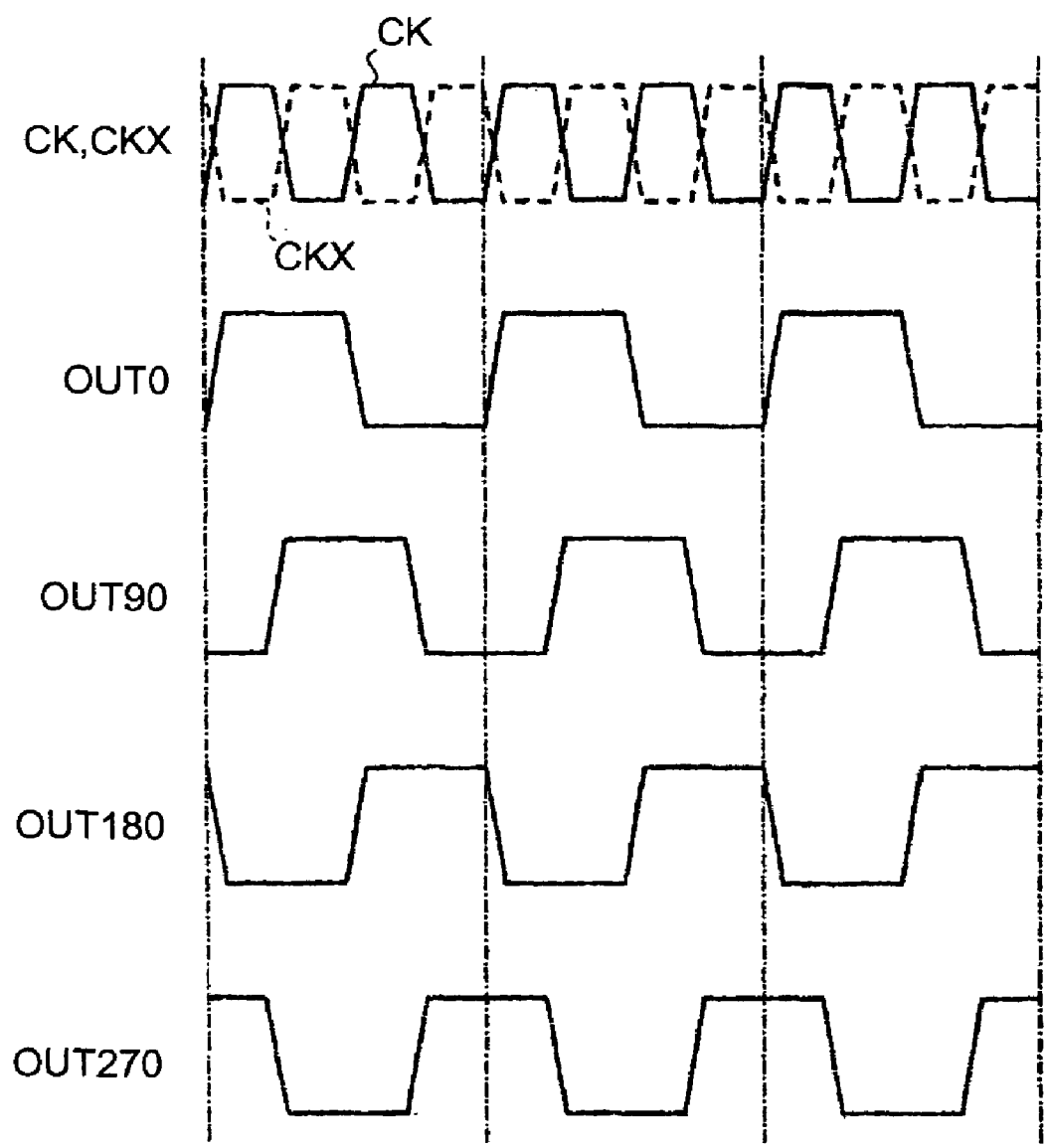
FIG. 17 is a schematic input/output waveforms of the 4-phase clock generator shown in FIG. 15.

FIG. 17 is a schematic of input/output waveforms of the 4-phase clock generator 1300 according to the fifth embodiment of the present invention. According to the fifth embodiment, since a phase shift or duty shift does not occur in the latch circuits 1301 and 1302, it is possible to obtain 4-phase clock signals having a phase difference of 90 degree from the 4-phase clock generator 1300 with high accuracy.

Figure 18:
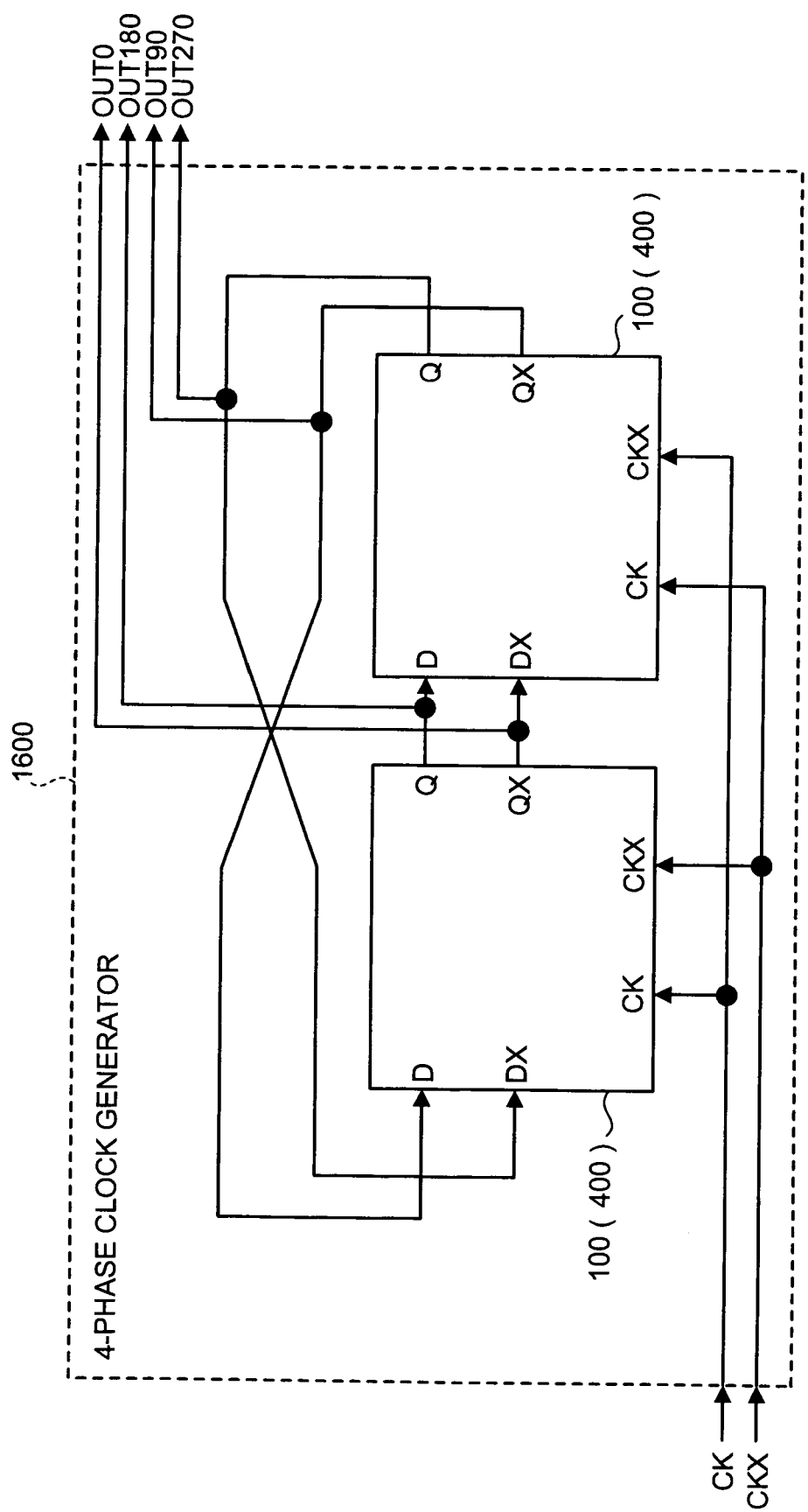
FIG. 18 is a circuit diagram of another 4-phase clock generator according to the fifth embodiment of the present invention.

Although, in the example, 4-phase clock generator 1300 includes two latch circuits 1000 according to the fourth embodiment, the 4-phase clock generator may be configured using the latch circuits 100 shown in FIG. 3 and FIG. 4, the latch circuits 400 shown in FIG. 6 and FIG. 9, or the latch circuits 800 shown in FIG. 10 and FIG. 11. FIG. 18 is a circuit diagram of a 4-phase clock generator 1600 using two latch circuits 100 (or latch circuits 400).

Since a phase shift or duty shift does not occur even in the 4-phase clock generator 1600 shown in FIG. 18, it is possible to obtain 4-phase clock signals having a phase difference of 90 degrees with high accuracy.

Next, a configuration of a 4-phase clock generator according to a sixth embodiment of the present invention will be explained. Any configuration described previously has a symmetrical structure in a circuit, thereby obtaining the clock signal accurately. However, when such circuit is actually manufactured as a semiconductor integrated circuit, the phase difference can deviate due to relative variation in characteristics of each of the MOS. An effective configuration of the latch circuit when such 4-phase clock generator is applied is explained below.

Figure 19:
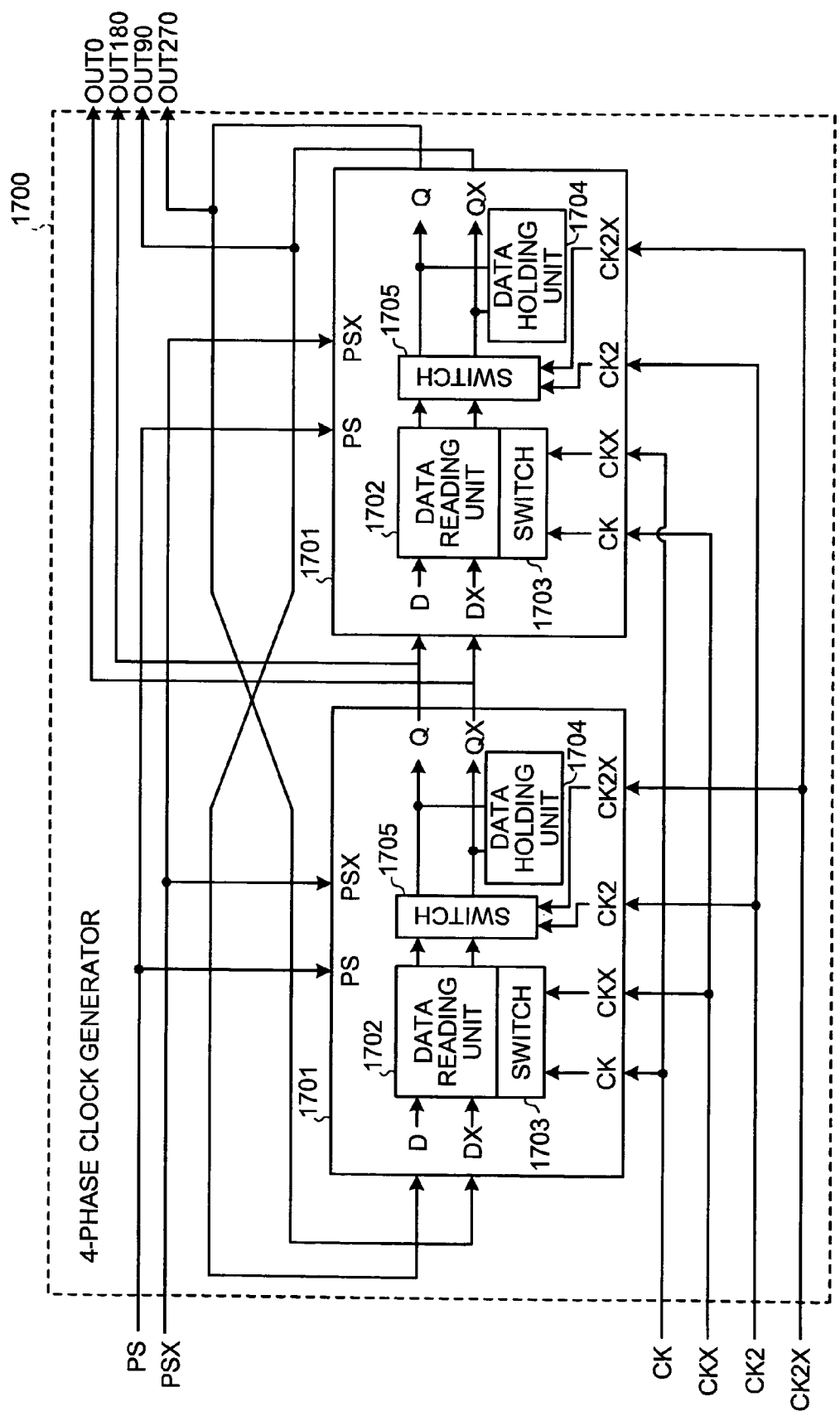
FIG. 19 is a block diagram of a 4-phase clock generator according to a sixth embodiment of the present invention.

FIG. 19 is a block diagram of the 4-phase clock generator according to the sixth embodiment. A 4-phase clock generator 1700 includes two latch circuits 1701. To a data reading unit 1702, a switch 1703 that is controlled by the clock signals CK and CKX is added. To a switch 1705 arranged between the data reading unit 1702 and a data holding unit 1704, a clock signals CK2 and CK2X having two times as much frequency as the clock signals CK and CKX are input.

Figure 20:
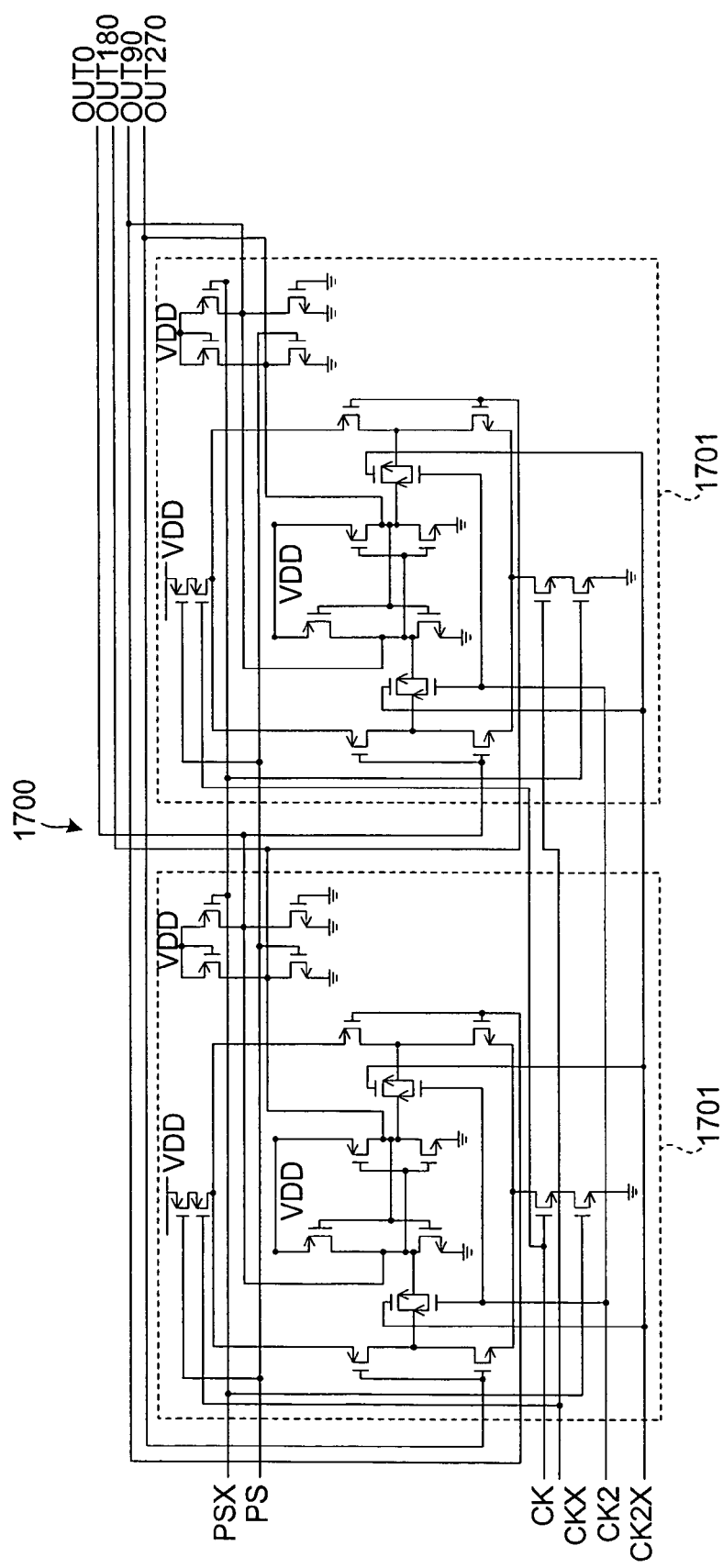
FIG. 20 is a circuit diagram of the 4-phase clock generator shown in FIG. 19.

Next, a circuit of the 4-phase clock generator shown in FIG. 19 will be explained. FIG. 20 is a circuit diagram of the 4-phase clock generator according to the sixth embodiment. As shown in FIG. 20, the latch circuits 1701 to which such two types of clock frequencies are input are connected similarly to an arrangement shown in FIG. 15. To clocks, each of a forward signal and a reverse signal of a basic frequency and a doubled frequency, which has a frequency doubled from the basic frequency, is input. While reading of data is performed at a timing determined based on the basic frequency as cases of other embodiments described above, a timing of transition of data in a 4-phase output is determined based on a timing of transition of the doubled frequency. Therefore, even if rising transition time and falling transition time in a clock waveform in the basic frequency are not uniform, the timing of transition of data in the 4-phase output can be determined without being affected by the nonuniformity. In other words, even when the characteristics of each of the MOS in the semiconductor integrated circuit have the relative variation, an influence of the relative variation on the 4-phase clock signal can be suppressed.

Figure 21:
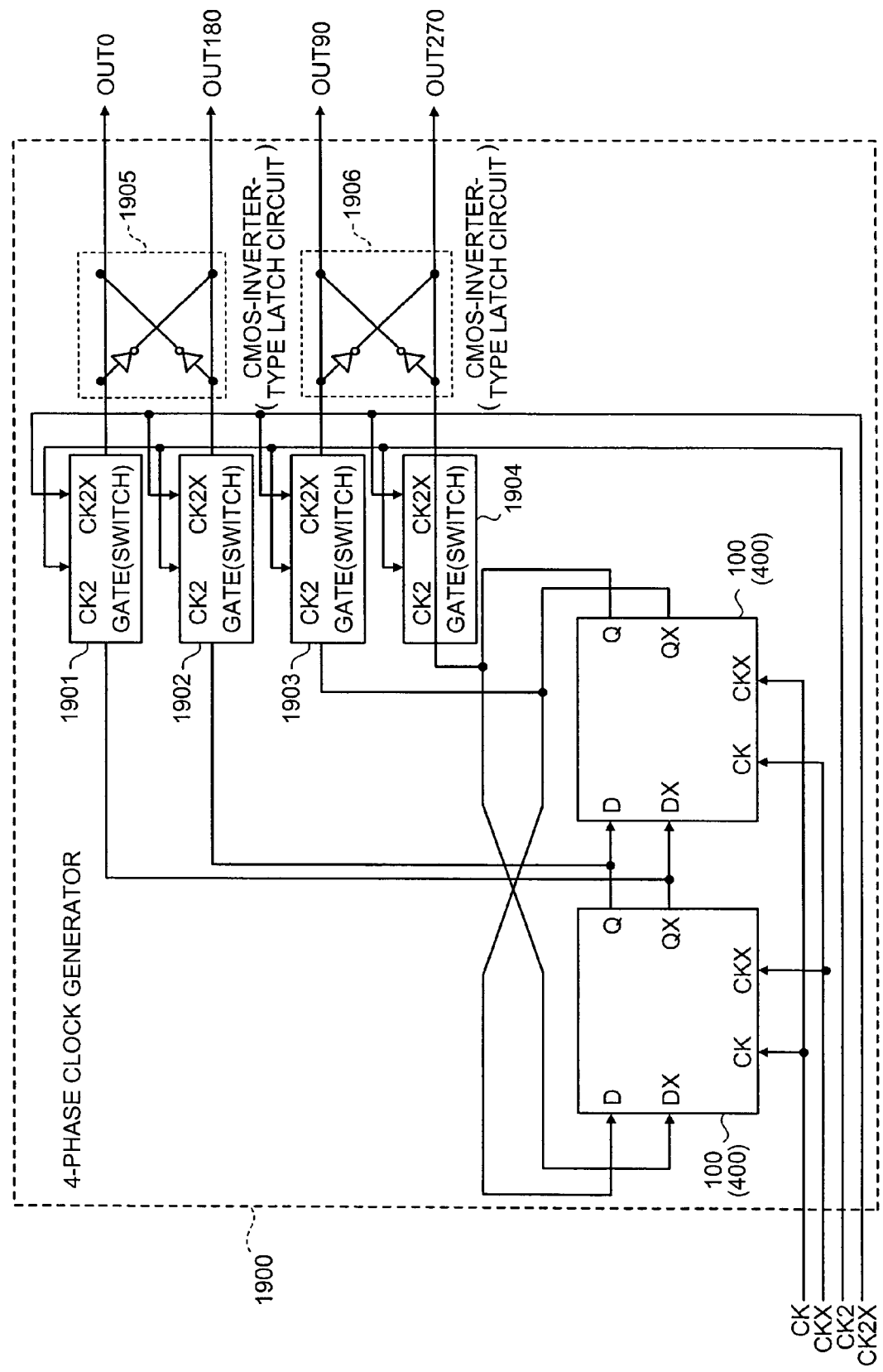
FIG. 21 is a block diagram of a 4-phase clock generator according to a seventh embodiment of the present invention.

Next, a configuration of a 4-pohase clock generator according to seventh embodiment of the present invention will be explained. FIG. 21 is a block diagram of the 4-phase clock generator according to the seventh embodiment. FIG. 21 illustrates a different configuration from that of the sixth embodiment. In the 4-phase clock generator 1900 shown in FIG. 21, gates (switches) 1901 to 1904 are equally arranged for 4-phase clock outputs, not in the latch circuit 100 (400) to be in ON state by synchronizing all of four phases with the clock signals CK2 and CK2X having two times as much frequency as the basic frequency. Thus, a timing of data transition in each output is corrected, and even when the characteristics of each of the MOS in the semiconductor integrated circuit have the relative variation, an influence of the relative variation on the 4-phase clock signal can be suppressed.

Figure 22:
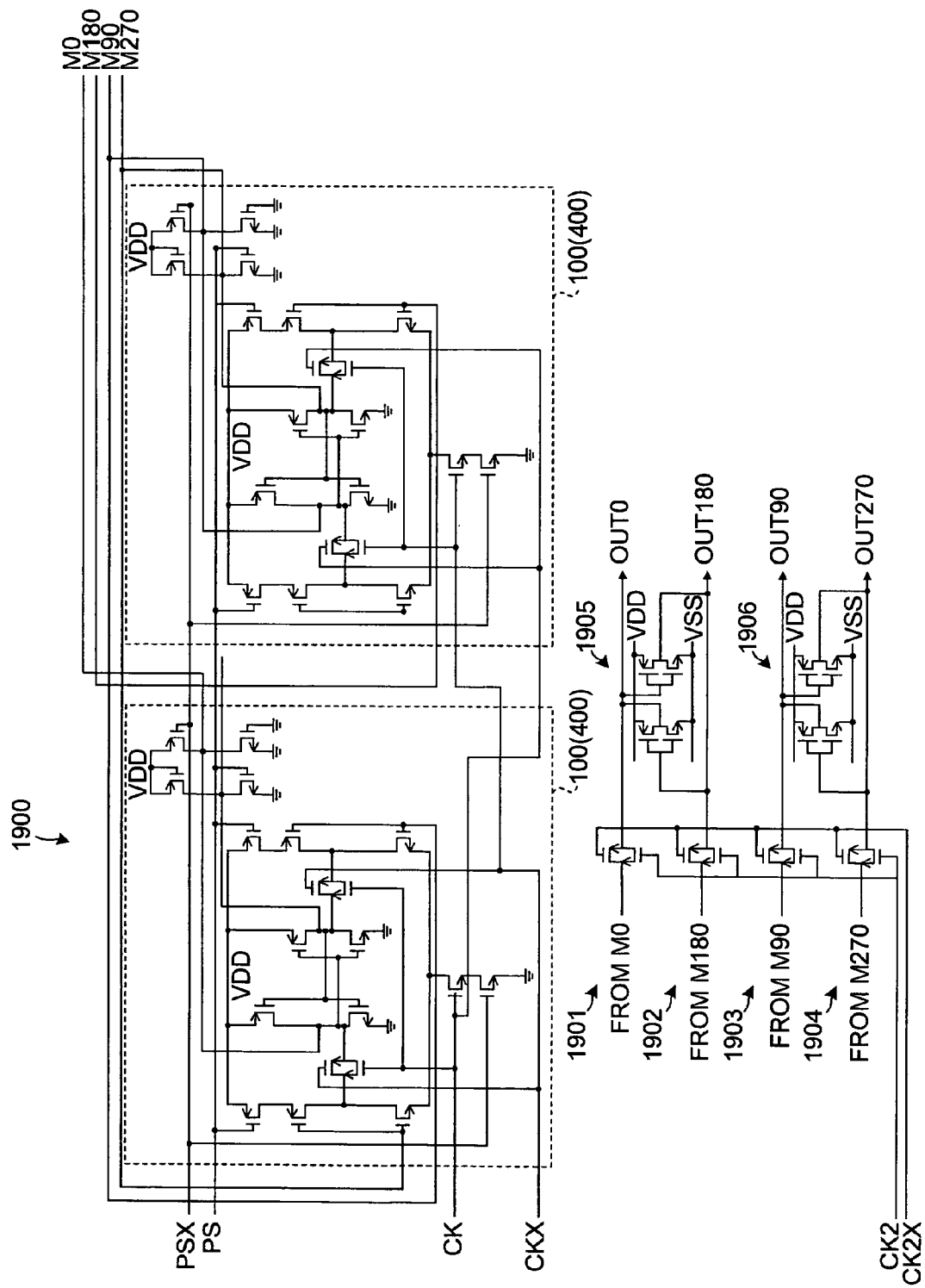
FIG. 22 is a circuit diagram of the 4-phase clock generator shown in FIG. 21.

Latch circuits 1905 and 1906 that are crosscoupled are added between output signals of 0 degree and 180 degrees and output signals of 90 degrees and 270 degrees. The latch circuits 1905 and 1906 function as a force to maintain an reverse state to each other even the switches 1901 to 1904 are brought in OFF state by the clock signals CK2 and CK2X, thereby eliminating an influence on output data. FIG. 22 is a circuit diagram of the 4-phase clock generator according to the seventh embodiment.

Figure 23:
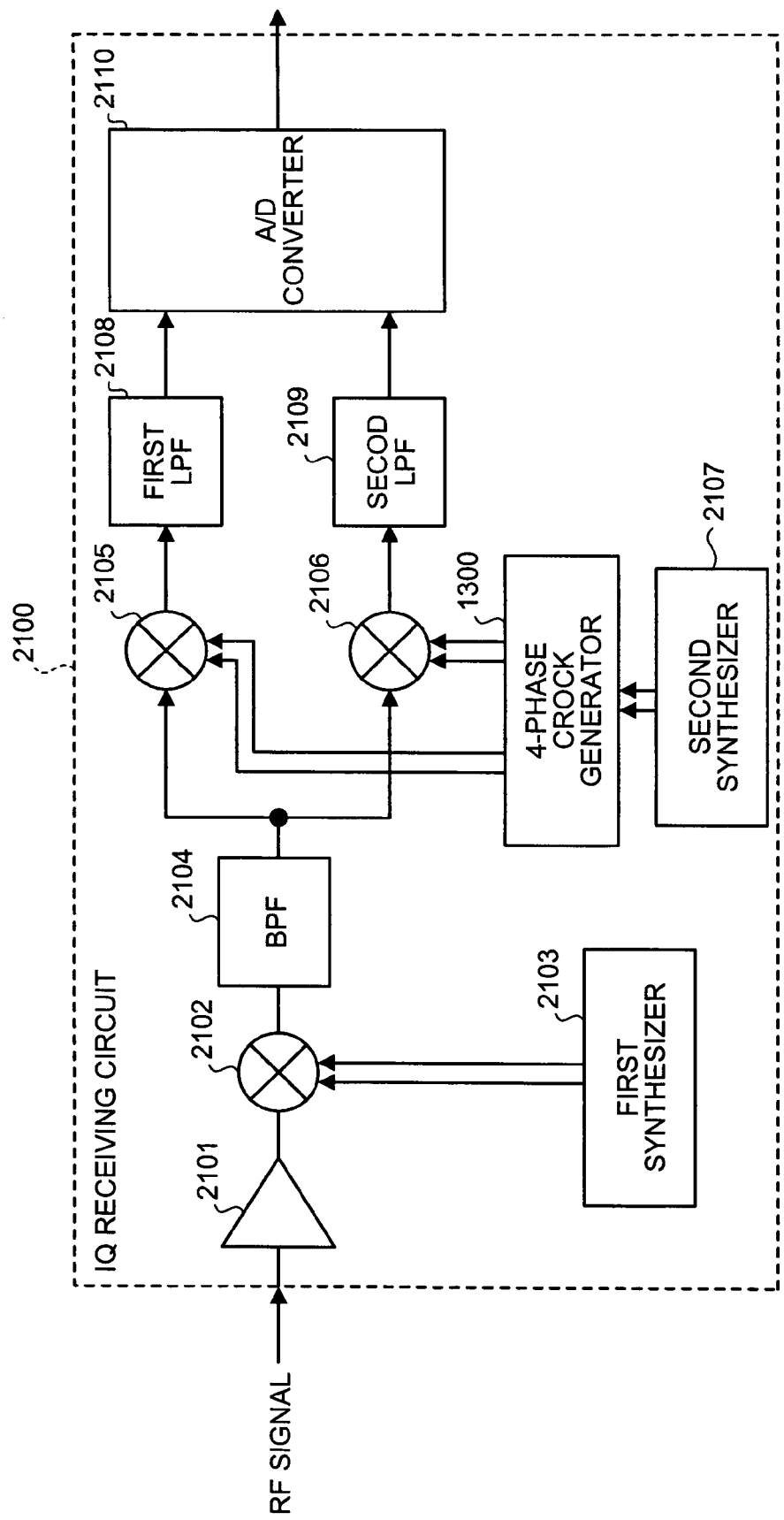
FIG. 23 is a block diagram of an IQ receiving circuit according to an eighth embodiment of the present invention.

Next, a configuration of an IQ receiving circuit according to a eighth embodiment of the present invention will be explained. The IQ receiving circuit according to the eighth embodiment uses the 4-phase clock generators 1300, 1600, 1700, and 1900 using latch circuit 100, 400, 800, 1000, or 1100 according to any one of the first to fourth embodiments. As one example, the IQ receiving circuit using the 4-phase clock generator 1300 according to the fifth embodiment will be explained. FIG. 23 is a block diagram of an IQ receiving circuit 2100 according to the eighth embodiment.

The IQ receiving circuit 2100 includes an amplifier circuit 2101, mixer circuits 2102, 2105, and 2106, synthesizers 2103 and 2107, a band pass filter (BPF) 2104, a 4-phase clock generator 1300, low pass filters (LPF) 2108 and 2109, and an A/D converter 2110.

When the IQ receiving circuit 2100 receives an RF signal, the amplifier circuit 2101 amplifies the RF signal, and the first mixer circuit 2102 converts the RF signal into an intermediate frequency signal at the first stage based on the signal having a desired frequency output from the first synthesizer 2103. While the intermediate frequency signal at the first stage passes through the band pass filter 2104, jamming signals that are out of band are eliminated.

Then, the signal is transmitted, from the band pass filter 2104, to the second mixer circuit 2105 and the third mixer circuit 2106. The 4-phase clock generator 1300 generates 4-phase signals (corresponding to the output data OUT0, OUT90, OUT180, and OUT270 according to the fifth embodiment) having phases that are shifted by 90 degree, based on signals (corresponding to the clock signals CK and CKX according to the fifth embodiment) having a desired frequency output from the second synthesizer 2107. The signals corresponding to OUT0 and OUT180 are transmitted to the second mixer circuit 2105, while the signals corresponding to OUT90 and OUT270 are transmitted to the third mixer circuit 2106.

The second mixer circuit 2105 converts the signals output from the band pass filter 2104 into intermediate frequency signals at the second stage, based on the signals corresponding to OUT0 and OUT180 output from the 4-phase clock generator 1300. The third mixer circuit 2106 coverts the signals output from the band pass filter 2104 into intermediate frequency signals at the second stage, based on OUT90 and OUT270 output from the 4-phase clock generator 1300. In this manner, the second mixer circuit 2105 and the third mixer circuit 2106 use the signals which are shifted by 90 degree to perform two mixings, thereby preventing overlapping due to image signals.

The intermediate frequency signals at the second stage is output from the second mixer circuit 2105 and the third mixer circuit 2106, and then pass through the first low pass filter 2108 and the second low pass filter 2109, respectively. Thus, only necessary signal components are extracted. The A/D converter 2110 converts the two signals from the first low pass filter 2108 and the second low pass filter 2109 into the digital signals, subjects the signals to appropriate computing, and extracts the signals without influence due to image signals.

According to the sixth embodiment, since the 4-phase clock generator 1300 generates the 4-phase clock signals having a phase difference of 90 degree with high accuracy, the 4-phase clock signals are used to perform mixing, thereby completely eliminating unwanted components from the received signals. Therefore, it is possible to prevent deterioration of the reception characteristics.

As explained above, the present invention is not limited to each of the embodiments, and can be modified in various ways. For example, part of the PMOS constituting the latch circuit may be replaced with NMOS, and conversely part of NMOS may be replaced with PMOS. The present invention is not limited to the IQ receiving method, and can be applied to the receiving method using the 4-phase clock generator such as heterodyne receiving method.

According to the present invention, it is possible to obtain an inverter-type latch circuit without phase shift or duty shift. By using this latch circuit, it is possible to obtain a 4-phase clock generator that generates 4-phase clock signals having a phase difference of 90 degree with high accuracy, and a receiving circuit such as IQ receiving method without deterioration of the reception characteristics.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A latch circuit comprising:
   a data reading unit that reads both a first input data and a second input data, and outputs both a first output data and a second output data based on both the first input data and the second input data, wherein both the first input data and the second input data are differential signals, and both the first output data and the second output data are differential signals that have phases that are inverted; and
   a data holding unit that holds both the first output data and the second output data, wherein
   the latch circuit operates based on a clock signal that is supplied from an outside source,
   both the data reading unit and the data holding unit are voltage driven type, and
   the data reading unit includes:
      a first pair of PMOS and NMOS transistors whose gates are directly connected to a first input node to which the first input data is input, and whose drains are directly or indirectly connected to a first output node from which the second output data is output;
      a second pair of PMOS and NMOS transistors whose gates are directly connected to a second input node to which the second input data is input, and whose drains are directly or indirectly connected to a second output node from which the first data is output;
      a timing control transistor that, based on the clock signal, controls a timing of reading both the first input data and the second input data that has a phase that is inverted with respect to the first input data;
      a first inverter circuit that includes the first pair and reads the first input data based on the timing, inverts the first input data into a first inverter output data, and outputs the first inverter output data as the first output data; and
      a second inverter circuit that includes the second pair and reads the second input data based on the timing, inverts the second input data into a second inverter output data, and outputs the second inverter output data as the second output data, and
   the data holding unit includes:
      a third inverter circuit that reads the second inverter output data, inverts the second inverter output data into a third inverter output data, and outputs the third inverter output data; and
      a fourth inverter circuit that reads the first inverter output data, inverts the first inverter output data into a fourth inverter output data, and outputs the fourth inverter output data, and
   the fourth inverter circuit reads the third inverter output data while the third inverter circuit reads the fourth inverter output data.

2. The latch circuit according to claim 1, further comprising a switch that
   is connected between the data reading unit and the data holding unit, and
   opens and closes based on the clock signal to perform both a control of outputting both the first output data and the second output data to an outside target and a control of inputting both the first output data and the second output data into the data holding unit.

3. The latch circuit according to claim 2, wherein the switch includes a transfer gate that operates based on the clock signal.

4. The latch circuit according to claim 2, wherein the switch includes a transistor that operates based on the clock signal.

5. The latch circuit according to claim 1, further comprising an output controller that
reads a control signal from an outside source, and
performs a control based on the control signal, such that both the first output data and the second output data have desired potentials when both the first output data and the second output data are output to an outside target.

6. The latch circuit according to claim 5, wherein the output controller causes, based on the control signal, the data reading unit to stop reading the first input data and the second input data.

7. A 4-phase clock generator comprising:
a first latch circuit that operates based on a clock signal supplied from an outside source, and includes a first data reading unit and a first data holding unit; and
a second latch circuit that operates based on the clock signal, and includes a second data reading unit and a second data holding unit; wherein
the first data reading unit
reads both a first input data and a second input data that are output from the second latch circuit via a first connection node and a second connection node, respectively, and
outputs both a first output data and a second output data, based on both the first input data and the second input data, to the second latch circuit via a third connection node and a fourth connection node, respectively,
the second data reading unit
reads both a third input data and a fourth input data that are output from the first latch circuit via the third connection node and the fourth connection node, respectively, and
outputs both a third output data and a fourth output data, based on both the third input data and the fourth input data, to the first latch circuit via the second connection node and the first connection node, respectively, wherein the first output data corresponds to the third input data, the second output data corresponds to the fourth input data, the third output data corresponds to the second input data, and the fourth output data corresponds to the first input data,
both the first input data and the second input data are differential signals, and both the third input data and the fourth input data are differential signals,
both the first output data and the second output data are differential signals that have phases that are inverted, and both the third output data and the fourth output data are differential signals that have phases that are inverted,
the first data holding unit holds both the first output data and the second output data, and the second data holding unit holds both the third output data and the fourth output data, and
4-phase signals that have phases that are shifted by 90 degree are output via the first connection node, the second connection node, the third connection node, and the fourth connection node.

8. The 4-phase clock generator according to claim 7, wherein each of the first latch circuit and the second latch circuit further includes:

a first switch that is arranged between the first data holding unit and the first data reading unit or between the second data holding unit and the second data reading unit, and that is controlled to be on and off with a frequency of twice a basic frequency; and
a second switch that controls reading operation of the first data reading unit or the second data reading unit to be on and off with the basic frequency.

9. The 4-phase clock generator according to claim 7, further comprising:
a plurality of gates that turn on and off in a frequency of twice a basic frequency to a plurality of nodes that output four-phase signals, respectively, each of the 4-phase signals having a phase difference of 90 degrees;
a first latch unit that retains data between two signals output from two of the gates and having a differential of phases of 0 degree and 180 degrees; and
a second latch unit that retains data between another two signals output from another two of the gates and having a differential of phases of 90 degrees and 270 degrees.

10. A receiving circuit comprising:
a 4-phase clock generator; and
an analog-digital (A/D) converter, wherein
the 4-phase clock generator includes
a first latch circuit that operates based on a clock signal supplied from an outside source, and includes a first data reading unit and a first data holding unit; and
a second latch circuit that operates based on the clock signal, and includes a second data reading unit and a second data holding unit,
the first data reading unit
reads both a first input data and a second input data that are output from the second latch circuit via a first connection node and a second connection node, respectively, and
outputs both a first output data and a second output data, based on both the first input data and the second input data, to the second latch circuit via a third connection node and a fourth connection node, respectively,
the second data reading unit
reads both a third input data and a fourth input data that are output from the first latch circuit via the third connection node and the fourth connection node, respectively, and
outputs both a third output data and a fourth output data, based on both the third input data and the fourth input data, to the first latch circuit via the second connection node and the first connection node, respectively, wherein the first output data corresponds to the third input data, the second output data corresponds to the fourth input data, the third output data corresponds to the second input data, and the fourth output data corresponds to the first input data,
both the first input data and the second input data are differential signals, and both the third input data and the fourth input data are differential signals,
both the first output data and the second output data are differential signals that have phases that are inverted, and both the third output data and the fourth output data are differential signals that have phases that are inverted,
the first data holding unit holds both the first output data and the second output data, and the second data holding unit holds both the third output data and the fourth output data,
a first signal, a second signal, a third signal, and a fourth signal are output via the fourth connection node, the third connection node, the first connection node, and the second connection node, the second signal having phase that is shifted by 180 degree with respect to the first signal, the third signal having phase that is shifted by 90 degree with respect to the first signal, and the fourth signal having phase that is shifted by 270 degree with respect to the first signal, and the A/D converter outputs desired digital signals based on a RF signal that is input to the receiving circuit, the first signal, the second signal, the third signal, and the fourth signal.

11. The receiving circuit according to claim 10, further comprising:

a first mixer circuit that converts the RF signal into a fifth signal that has lower frequency than the RF signal;

a second mixer circuit that converts the fifth signal into a sixth signal that has lower frequency than the fifth signal based on the first signal and the second signal; and a third mixer circuit that converts the fifth signal into a seventh signal that has lower frequency than the fifth signal based on the third and fourth signals, wherein the A/D converter outputs the desired digital signals based on the sixth signal and the seventh signal.

12. A latch circuit comprising:

a data reading unit that reads both a first input data and a second input data, and outputs both a first output data and a second output data based on both the first input data and the second input data, wherein both the first input data and the second input data are differential signals, and both the first output data and the second output data are differential signals that have phases that are inverted;

a data holding unit that holds both the first output data and the second output data; and an output controller that reads a control signal from an outside source, and performs a control based on the control signal, such that both the first output data and the second output data have desired potentials when both the first output data and the second output data are output to an outside target, wherein the latch circuit operates based on a clock signal that is supplied from an outside source, both the data reading unit and the data holding unit are voltage driven type, and the data reading unit includes a first pair of PMOS and NMOS transistors whose gates are directly connected to a first input node to which the first input data is input, and whose drains are directly or indirectly connected to a first output node from which the second output data is output, and a second pair of PMOS and NMOS transistors whose gates are directly connected to a second input node to which the second input data is input, and whose drains are directly or indirectly connected to a second output node from which the first data is output.

13. The latch circuit according to claim 12, wherein the output controller causes, based on the control signal, the data reading unit to stop reading the first input data and the second input data.

* * * * *